United States Patent
Iwata

(10) Patent No.: US 7,027,325 B2
(45) Date of Patent: Apr. 11, 2006

(54) MAGNETIC RANDOM ACCESS MEMORY

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 10/890,455

(22) Filed: Jul. 14, 2004

(65) Prior Publication Data

US 2005/0254294 A1    Nov. 17, 2005

(30) Foreign Application Priority Data

May 11, 2004    (JP)    .............................. 2004-140988

(51) Int. Cl.
*G11C 11/00*    (2006.01)

(52) U.S. Cl. ...................... 365/158; 365/171
(58) Field of Classification Search ................ 365/213, 365/158, 157, 171, 209, 211
See application file for complete search history.

(56) References Cited

U.S. PATENT DOCUMENTS

| | | | |
|---|---|---|---|
| 6,625,057 | B1 | 9/2003 | Iwata |
| 6,865,104 | B1* | 3/2005 | Perner ........................ 365/158 |
| 6,868,025 | B1* | 3/2005 | Hsu ............................ 365/211 |
| 2003/0123199 | A1 | 7/2003 | Honda et al. |
| 2005/0078537 | A1* | 4/2005 | So et al. ...................... 365/211 |
| 2005/0128793 | A1* | 6/2005 | Ho et al. ..................... 365/158 |

OTHER PUBLICATIONS

U.S. Appl. No. 10/765,131, filed Jan. 28, 2004, Iwata et al.
U.S. Appl. No. 10/807,454, filed Mar. 24, 2004, Iwata et al.
Chag He Shang, et al., "Temperature Dependence of Magnetoresistance and Surface Magnetization in Ferromagnetic Tunnel Junctions", Physical Review B, vol. 58, No. 6, Aug. 1, 1998, pp. R2917-R2920.
J. Zhang, et al., "Voltage Dependence of Magnetoresistance in Spin Dependent Tunneling Junctions", Journal of Applied Physics, vol. 83, No. 11, Jun. 1, 1998, pp. 6512-6514.
J. S. Moodera, et al., "Large Magnetoresistance at Room Temperature in Ferromagnetic Thin Film Tunnel Junctions", Physical Review Letters, vol. 74, No. 16, Apr. 17, 1995, pp. 3273-3276.
S. Zhang, et al., "Quenching of Magnetoresistance by Hot Electrons in Magnetic Tunnel Junctions", Physical Review Letters, vol. 79, No. 19, Nov. 10, 1997, pp. 3744-3747.

(Continued)

*Primary Examiner*—Anh Phung
*Assistant Examiner*—Hien Nguyen
(74) *Attorney, Agent, or Firm*—Oblon, Spivak, McClelland, Maier & Neustadt, P.C.

(57) ABSTRACT

A magnetic random access memory according to examples of the present invention comprises a magneto resistive element MTJ, and current source circuits I1, I2 and I3 which give a bias current/voltage to the magneto resistive element MTJ when data in the magneto resistive element MTJ is read, wherein a value of the bias current/voltage changes depending on temperature without depending on a power supply potential.

21 Claims, 28 Drawing Sheets

OTHER PUBLICATIONS

M. Durlam, et al., "Nonvolatile RAM Based on Magnetic Tunnel Junction Elements", ISSCC 2000/Session 7 / TD: Emerging Memory & Device Technologies / Paper TA 7.3, IEEE International Solid-State Circuits Conference, 2000, (5 pages).

Roy Scheuerlein, et al., "A 10ns Read and Write Non-Volatile Memory Array Using a Magnetic Tunnel Junction and FET Switch in Each Cell", ISSCC 2000 / Session 7 / TD: Emerging Memory & Device Technologies / Paper TA 7.2, IEEE International Solid-State Circuits Conference, 2000, (6 pages).

Peter K. Naji, et al., "A 256kb 3.0V 1T1MTJ Nonvolatile Magnetoresistive RAM", ISSCC 2001 / Session 7 / Technology Directions: Advanced Technologies / 7.6, IEEE International Solid-State Circuits Conference, 2001, (3 pages).

Hironori Banba, et al., "A CMOS Bandgap Reference Circuit with Sub-1-V Operation", IEEE Journal of Solid-State Circuits, vol. 34, No. 5, May 1999, pp. 670-674.

F. Montaigne, et al., "To Which Extent is the Influence of Each Electrode of a Magnetic Tunnel Junction Separable", Journal of Applied Physics, vol. 91, No. 10, May 15, 2002, pp. 7020-7022.

* cited by examiner

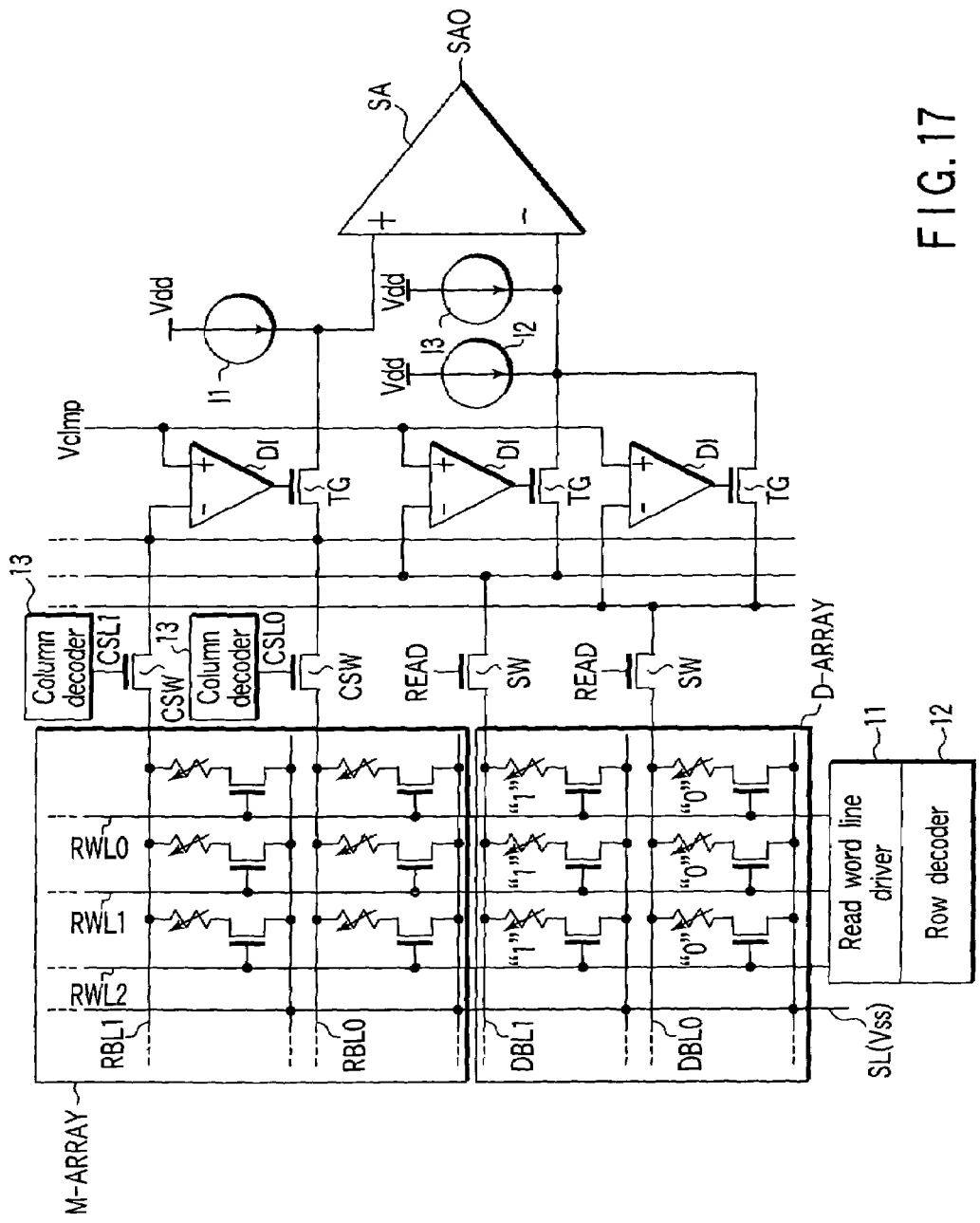
F I G. 17

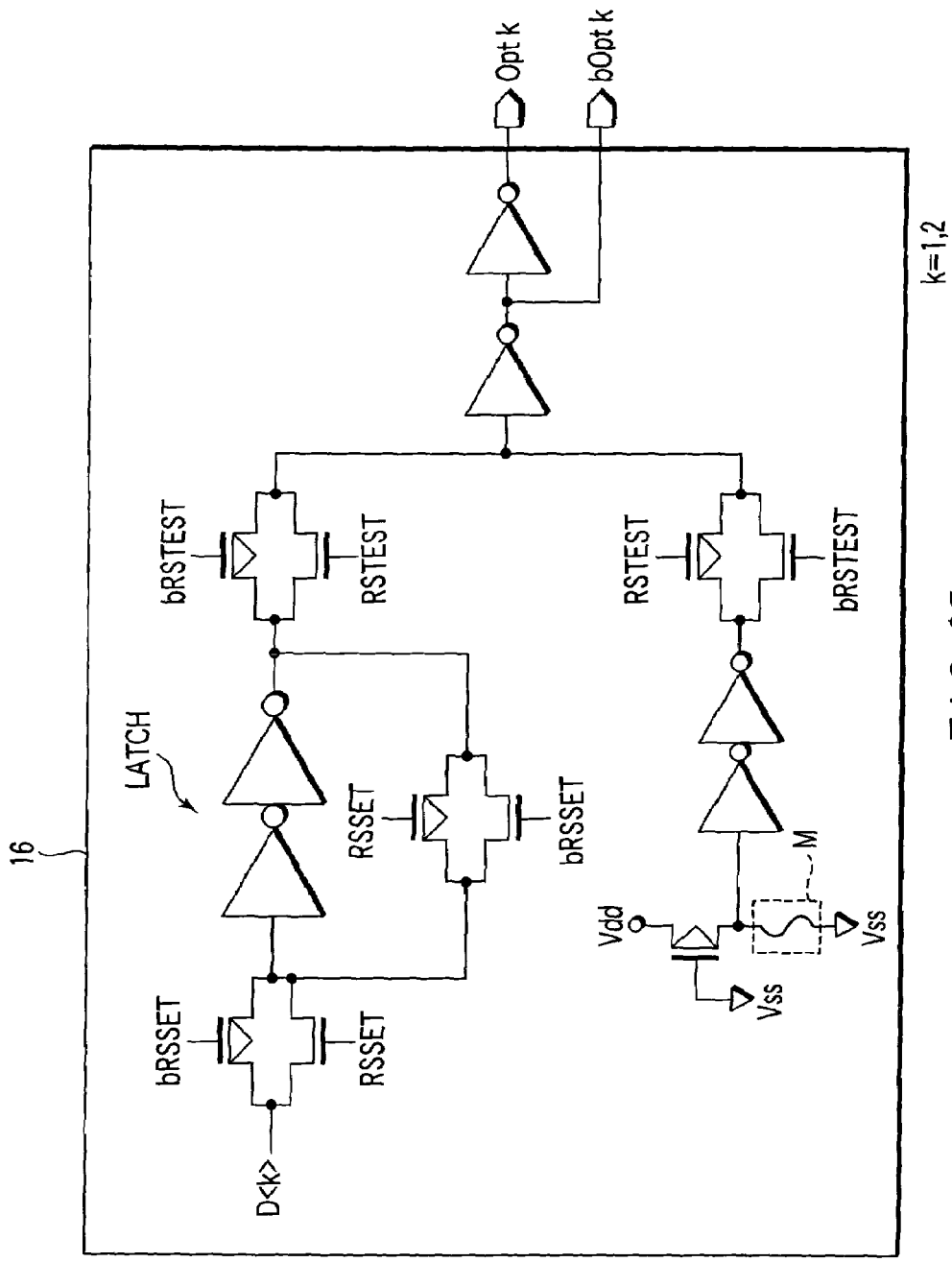
F I G. 25

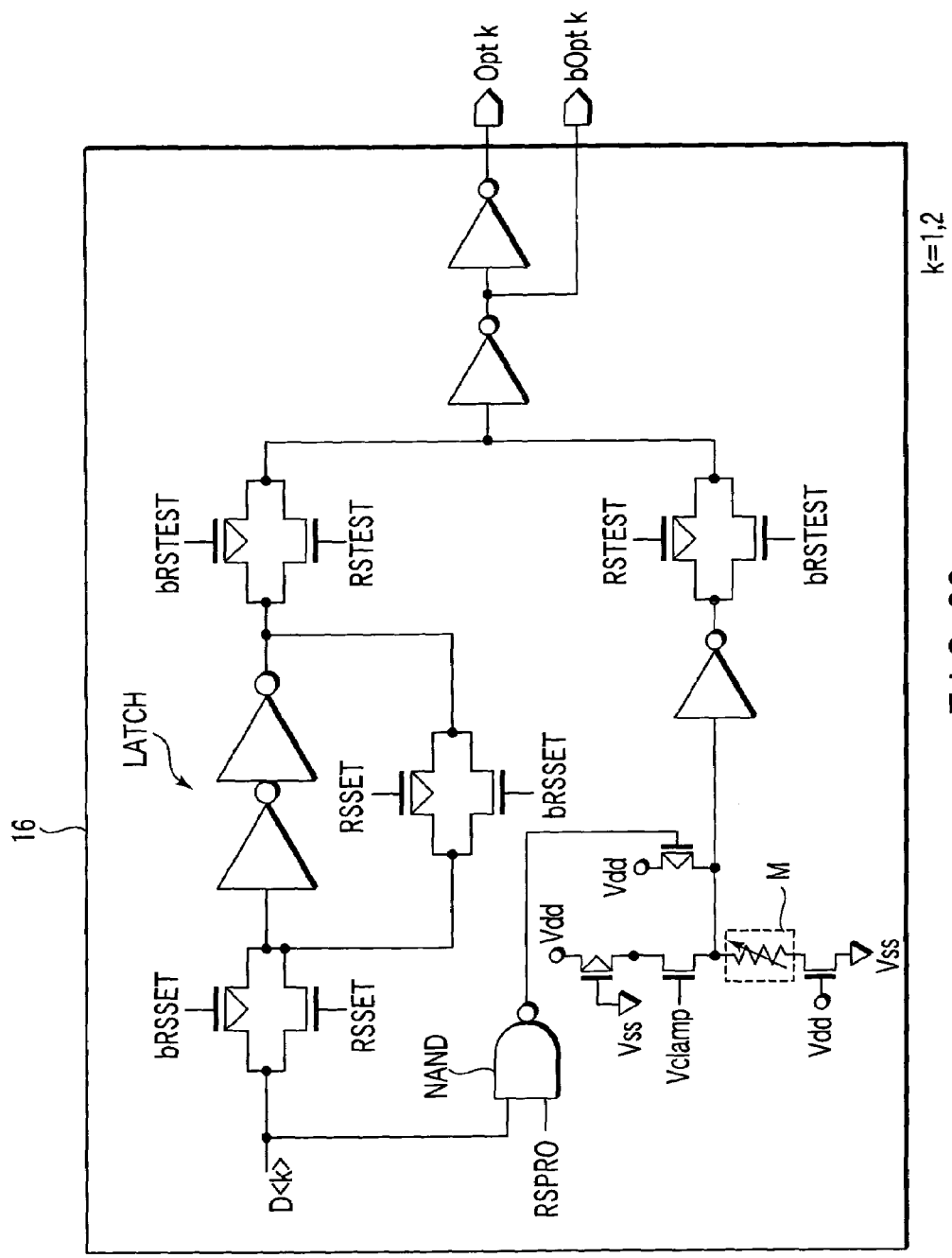
F I G. 26

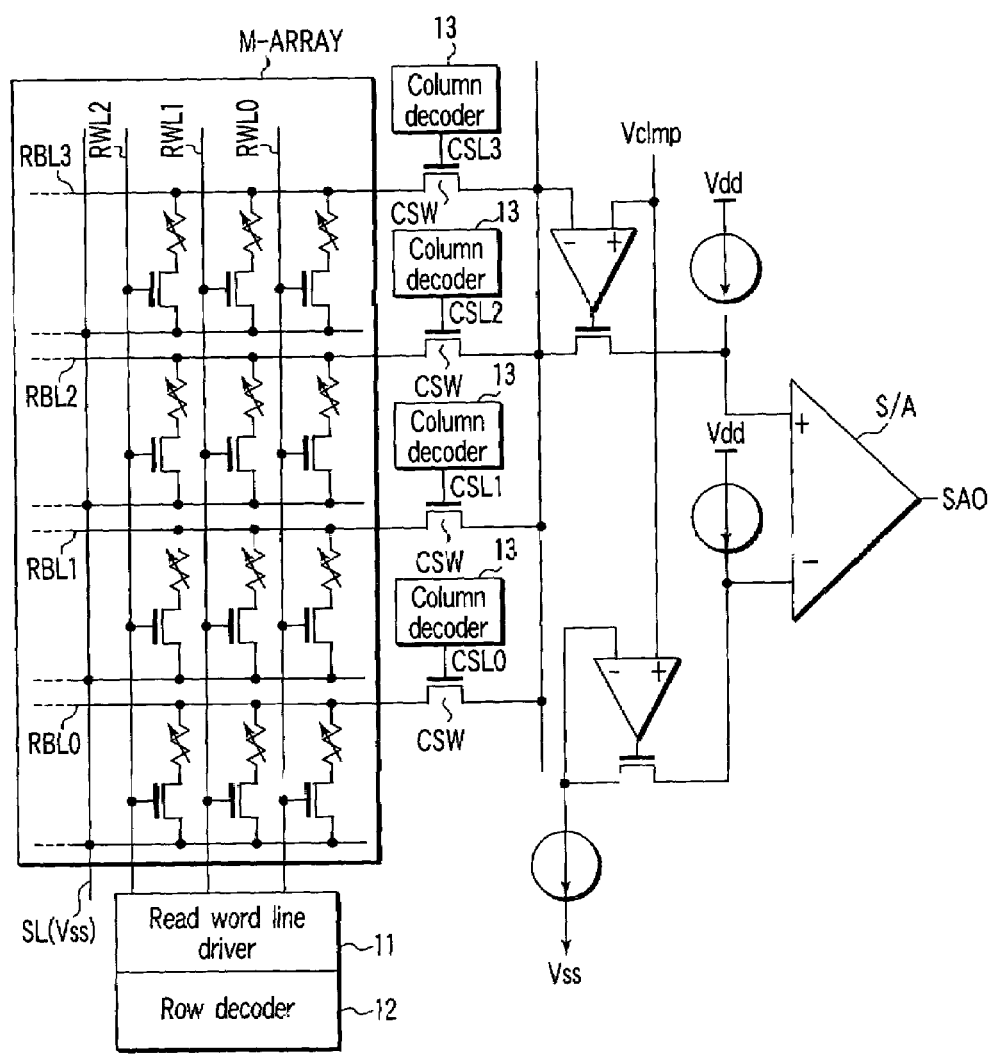
F I G. 28

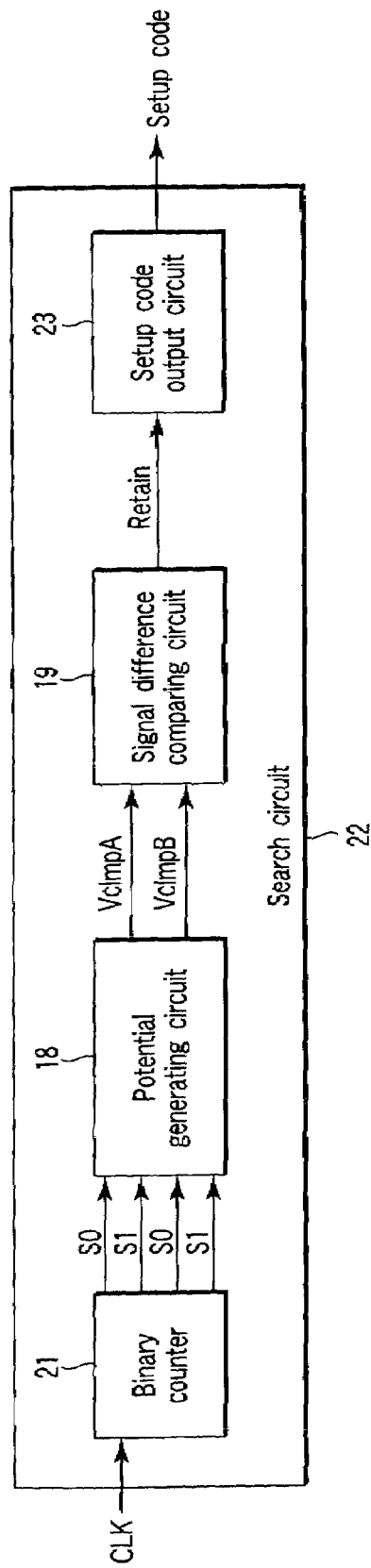
F I G. 30

MAGNETIC RANDOM ACCESS MEMORY

CROSS-REFERENCE TO RELATED APPLICATIONS

This application is based upon and claims the benefit of priority from prior Japanese Patent Application No. 2004-140988, filed May 11, 2004, the entire contents of which are incorporated herein by reference.

BACKGROUND OF THE INVENTION

1. Field of the Invention

The present invention relates to a magnetic random access memory (MRAM) utilizing a magneto resistive effect.

2. Description of the Related Art

A magnetic random access memory utilizing a tunneling magneto resistive (TMR) effect is characterized in that data is stored in accordance with a magnetizing state of an MTJ (magnetic tunnel junction) element.

The MTJ element showing the TMR has a configuration in which a tunnel insulating layer is placed between two ferromagnetic layers. The MTJ element can take two states. One is a parallel state in which remnant magnetizations of the two ferromagnetic layers sandwiching the tunnel insulating layer are in the same direction, and the other is an antiparallel state in which the remnant magnetizations of the two ferromagnetic layers sandwiching the tunnel insulating layer are in the directions opposite to each other.

When the MTJ element is in the parallel state, the MTJ element has the lowest resistance value. This state is a "1" state. On the other hand, when the MTJ element is in the antiparallel state, the MTJ element has the highest resistance value. This state is a "0" state.

Here, electron spin is quantized in the magnetizing direction, and the magnetizing direction and the direction of the electron spin have a relationship in which they are in the same direction (parallel state) or in the opposite direction (antiparallel state) as described above.

Because energy of electrons differs between the two states, density of states of the electrons in the vicinity of Fermi level of ferromagnetic materials varies depending on whether the magnetizing direction and the direction of the electron spin are the same or opposite. Therefore, a tunnel current flowing through the thin insulating layer sandwiched between the ferromagnetic materials also varies depending on whether the magnetizing direction and the direction of the electron spin are the same or opposite.

In other words, tunneling probability is proportionate to both the density of states of a transition source and the density of states of a transition end, thus when the MTJ element is in the antiparallel state, the density of states of the transition source differs from that of the transition end.

Therefore, the tunneling probability when the MTJ element is in the antiparallel state is increased or decreased as compared with the tunneling probability when the MTJ element is in the parallel state.

It is to be noted that an MR ratio represents a value in which a difference between a resistance value when the MTJ element is in the parallel state and a resistance value when the MTJ element is in the antiparallel state is divided by a resistance value when the MTJ element is in the parallel state or antiparallel state (generally, the resistance value when the MTJ element is in the parallel state is used).

Meanwhile, it is known that the TMR has temperature dependency, but countermeasures against this have not heretofore been adequately taken. Moreover, the TMR has bias dependency, and has a so-called optimum applied voltage that maximizes a signal amount, but this optimum applied voltage and temperature dependency have not heretofore been taken into consideration in designing.

BRIEF SUMMARY OF THE INVENTION

A magnetic random access memory according to an aspect of the present invention comprises a magneto resistive element; and a current source circuit which gives an electric bias to the magneto resistive element when data in the magneto resistive element is read, wherein a value of the electric bias changes depending on temperature without depending on a power supply potential.

BRIEF DESCRIPTION OF THE SEVERAL VIEWS OF THE DRAWING

FIG. 17 is a circuit diagram showing the read circuit according to a second embodiment;

FIG. 25 is a circuit diagram showing a setting circuit according to the fourth embodiment;

FIG. 26 is a circuit diagram showing the setting circuit according to the fourth embodiment;

FIG. 28 is a circuit diagram showing the read circuit according to the fifth embodiment;

FIG. 30 is a circuit diagram showing a search circuit according to a seventh embodiment;

DETAILED DESCRIPTION OF THE INVENTION

Figure 1:
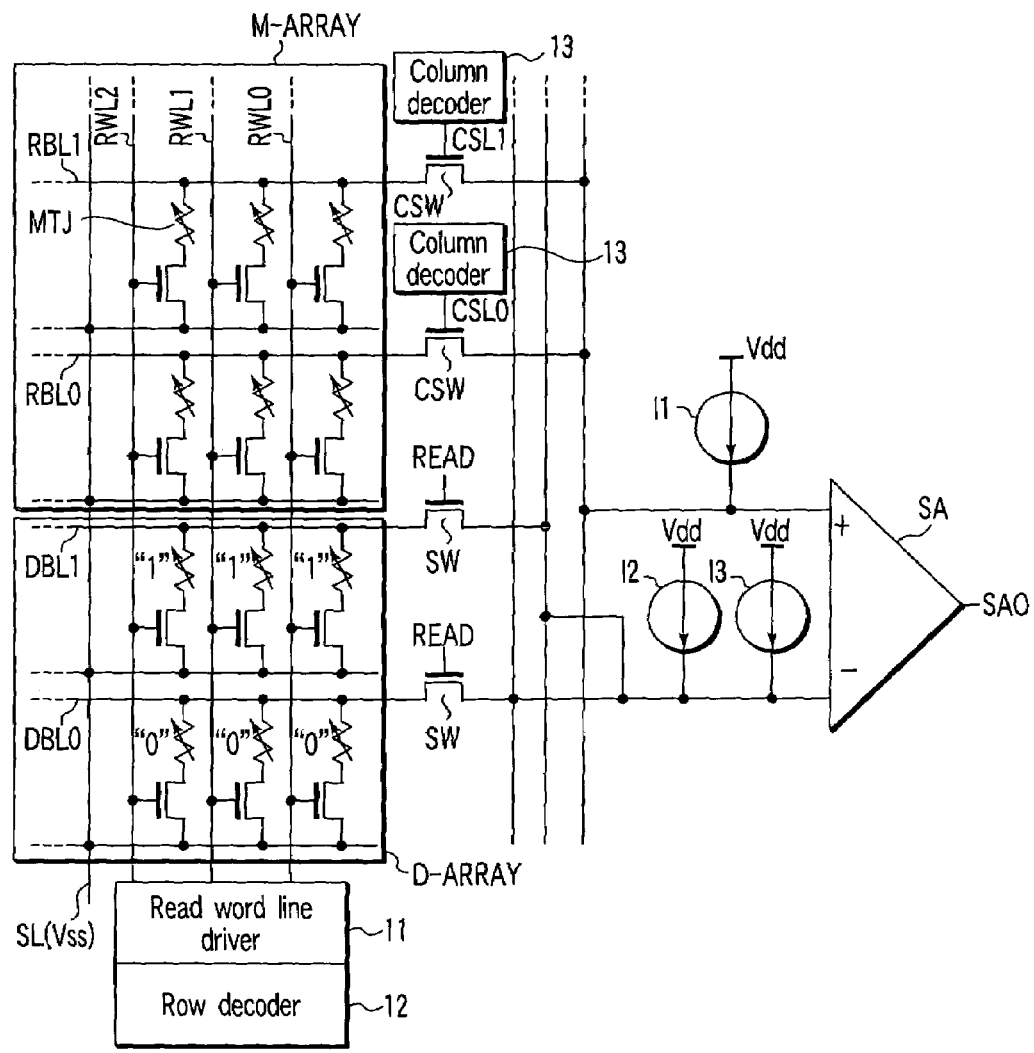
FIG. 1 is a circuit diagram showing a read circuit according to a first embodiment.

A magnetic random access memory of an aspect of the present invention will be described below in detail with reference to the accompanying drawings.

1. REFERENCE EXAMPLE

First, temperature dependency of a TMR is considered. The density of states of electrons in the vicinity of the Fermi level of ferromagnetic materials changes depending on temperature. If a potential difference between the two ferromagnetic materials constituting an MTJ element becomes large, the density of states of the electrons associated with conduction changes.

Therefore, an MR ratio of the MTJ element is temperature dependent, and further is dependent on a bias voltage applied across the two ferromagnetic materials.

It is believed that temperature dependency and the bias voltage dependency are attributed to magnons excited locally at an interface of insulating layers (tunnel barrier) constituting the MTJ element. In other words, if the magnons are excited and tunneling of the magnons to cause a spin inversion of the conducting electrons occurs, the MR ratio is lowered.

Furthermore, temperature dependency and the bias voltage dependency are also associated with broadening of a distribution function due to the presence of a temperature term of a Fermi-Dirac distribution function, decrease of polarizability, and an increase of a tunnel current which is not dependent on the spin.

In one example of an increase caused in the tunnel current which is not dependent on the spin, alumina is used for the tunnel barrier. If oxidation of aluminum is insufficient and aluminum remains in alumina, the tunnel current flowing through the MTJ element will not be dependent on the spin, and an amount of current flowing through the MTJ element will increase in accordance with an increase of the bias voltage, thus lowering the MR ratio, because aluminum is a paramagnetic material.

On the contrary, if the oxidation of aluminum is excessive, the ferromagnetic material is oxidized at the same time and is not a ferromagnetic material any more, so that the current flowing through this part is not dependent on the spin, with the result that the MR ratio is lowered.

Meanwhile, an amount of a read current is increased due to an increase of the bias voltage, but in this case, a signal difference between "1" and "0" decreases. Therefore, it is necessary to search for a bias voltage optimum for reading.

A relationship between the signal difference and the bias voltage will hereinafter be described.

The MR ratio is indicated as a linear function of the bias voltage.

Here, a case is considered in which the MTJ element is supplied with a constant current that does not have temperature dependency and power supply voltage dependency. While the voltage dependency of the MR ratio is taken into account, the voltage dependency of a resistance value of the MTJ element is neglected since it has an effect smaller than that of the voltage dependency of the MR ratio.

If Ib is a bias current, Rm is the resistance value of the MTJ element in a parallel state, and Vh is the bias voltage at which MR0 (a value in which the MR ratio when the bias voltage is 0V is deducted from a measurement result of bias dependency) is half, the bias voltage dependency of the MR ratio can be expressed as a linear function in the following manner (nonpatent literature).

$$MR(V)=MR0 \times (1-V/2 \cdot Vh)$$

(where V is the bias voltage, and MR(V) is the MR ratio when the bias voltage V is given.)

An output voltage Vp of the MTJ element (parallel state) when a constant current bias is applied is $$Vp=Ib \times Rm, \text{ and}$$

an output voltage Va of the MTJ element (antiparallel state) when the constant current bias is applied is $$Va=Ib \times Rm \times [1+MR(Va)]$$

A signal difference $\Delta V$ of both the output voltages is $$\Delta V = Va - Vp$$
$$= Ib \times Rm \times MR(Va)$$
$$= Ib \times Rm \times MR0 \times (1 - Va/2 \cdot Vh).$$

From MR<1, Va≈Vp is possible, and $$\Delta V = Vp \times MR0 \times (1-Vp/2 \cdot Vh)$$

$$d\Delta V/dVp = MR0 \times (1-Vp/Vh).$$

Therefore, when Vp=Vh, the signal difference is maximized in a range of 0<Vp<2·Vh.

From the above, if the bias current applied to the MTJ element is decided so that the potential difference produced between both ends of the MTJ elements is Vh, the signal difference is maximum.

Next, a case will be considered in which a constant voltage that does not have temperature dependency and power supply voltage dependency is applied to the MTJ element to read the current flowing through the MTJ element as a signal. Also here, while the voltage dependency of the MR ratio is taken into account, the voltage dependency of the resistance value of the MTJ element is neglected since it has an effect smaller than that of the voltage dependency of the MR ratio.

If Vb is the bias voltage,
an output current Ip of the MTJ element (parallel state) will be $$Ip = Vb/Rm, \text{ and}$$

an output current Ia of the MTJ element (antiparallel state) will be $$Ia = Vb/\{Rm \times [1+MR(Vb)]\}.$$

A signal difference ΔI between both the output voltages is $$\Delta I = Ip - Ia$$
$$= Vb/Rm \times MR(Vb)/[1+MR(Vb)]$$
$$= Vb/Rm \times MR0 \times (1 - Vb/2 \cdot Vh)/[1+MR0 \times (1-Vb/2 \cdot Vh)].$$

Therefore, $$d\Delta I/dVb = MR0^2/Rm \cdot [Vb/2Vh - \{1+MR0+(1+MR0)\\0.5\}/MR0] \times [Vb/2 \cdot Vh - \{1+MR0-(1+MR0)0.5\}/\\MR0] \cdot [1+MR0 \cdot (1-Vb/2 \cdot Vh)]-2.$$

From MR0<1,
if approximate as $(1+MR0)0.5 \approx 1+MR0/2$, $$d\Delta I/dVb = MR0^2/Rm \cdot [Vb/2 \cdot Vh - (2+1.5 \cdot MR0)/MR0] \cdot\\ [Vb/2 \cdot Vh - 0.5] \cdot [1+MR0 \cdot (1-Vb/2 \cdot Vh)]-2.$$

Therefore, when Vp=Vh, the signal difference is maximized in a range of 0<Vp<2Vh.

From the above, if the bias current applied to the MTJ element is decided so that the potential difference produced between both ends of the MTJ elements is Vh, the signal difference is maximum.

In this way, during read, an optimum value of the bias current/voltage to produce the largest signal difference is present, and the MR ratio has temperature dependency and bias voltage dependency, thus it is very important that such an optimum value of the bias current/voltage has temperature dependency.

A general semiconductor integrated circuit is constituted of elements such as transistors, resistors and capacitors. For this reason, in order to decide, in accordance with temperature dependency of the MTJ element, the optimum value of the bias current/voltage that produces the largest signal difference, a new bias current/voltage generating circuit will be needed.

The expression "bias current/voltage" means that a bias current flows when a bias voltage is applied, and a bias voltage is applied when a bias current flows.

2. EMBODIMENTS

A plurality of embodiments regarded as the best for the magnetic random access memory according to examples of the present invention will be described below.

As the examples of the present invention are concerned with a read circuit considering temperature dependency of the TMR, a write circuit is omitted here for easier understanding of the description.

(1) First Embodiment

[1] Read Circuit

FIG. 1 shows the read circuit according to a first embodiment.

A memory cell array M-ARRAY is constituted of one transistor/one MTJ type memory cells.

Sources of the transistors constituting the memory cell are connected to a source line (ground potential Vss) SL, and drains thereof are connected to the MTJ elements, and gates thereof are connected to read word lines RWL0, RWL1 RWL2, . . . . One end of the MTJ element is connected to a read bit line RBL0, RBL1, . . . .

One end of the read word line RWL0, RWL1 RWL2, . . . is connected to a read word line driver 11. During read, because one row is selected by a row decoder 12, the read word line driver 11 drives the read word line belonging to the selected row on the basis of a decoding result by the row decoder 12.

The read bit line RBL0, RBL1, . . . is connected to a noninverting terminal of a differential amplifier as a sense amplifier SA via a column selecting switch CSW. The column selecting switch CSW is turned on/off under the control of an output signal CSL0, CSL1, . . . of column decoders 13.

A current source I1 supplies a bias current to the MTJ element of the selected memory cell during read. The bias current flows through the MTJ element such that a potential of the noninverting terminal of the differential amplifier as the sense amplifier SA has a value corresponding to data in the MTJ element.

A reference cell array D-ARRAY is constituted of the one transistor/one MTJ type memory cells, similarly to the memory cell array M-ARRAY.

The sources of the transistors constituting the reference cell are connected to the source line (ground potential Vss) SL, and the drains thereof are connected to the MTJ elements, and the gates thereof are connected to the read word lines RWL0, RWL1 RWL2, . . . . One end of the MTJ element is connected to a reference bit line DBL0, DBL1, . . . .

The reference bit line DBL0, DBL1, . . . is connected to an inverting terminal of the differential amplifier as the sense amplifier SA via a selecting switch SW. The selecting switch SW is turned on/off under the control of a read signal READ. More specifically, during read, because the read signal READ is "H", a reference potential necessary for reading data is generated by a reference cell.

Here, for example, the state of the MTJ elements of the reference cells connected to the reference bit line DBL0 is all set to "0" (antiparallel state), and the state of the MTJ elements of the reference cells connected to the reference bit line DBL1 is all set to "1" (parallel state).

In this case, during read, if the bias current is supplied by current sources I2 and I3 to the MTJ element of the reference cell belonging to the selected row, a reference potential necessary for reading is input to the inverting terminal of the differential amplifier as the sense amplifier SA.

According to the examples of the present invention, in the read circuit as described above, the value of the bias current is adjusted so that, during read, the potential difference (bias potential) produced between both ends of the MTJ elements of the memory cell and the reference cell will be Vh (a voltage at which the MR ratio will be half of an MR ratio MR0 during bias application).

[2] Current Source Circuit

Figure 2:
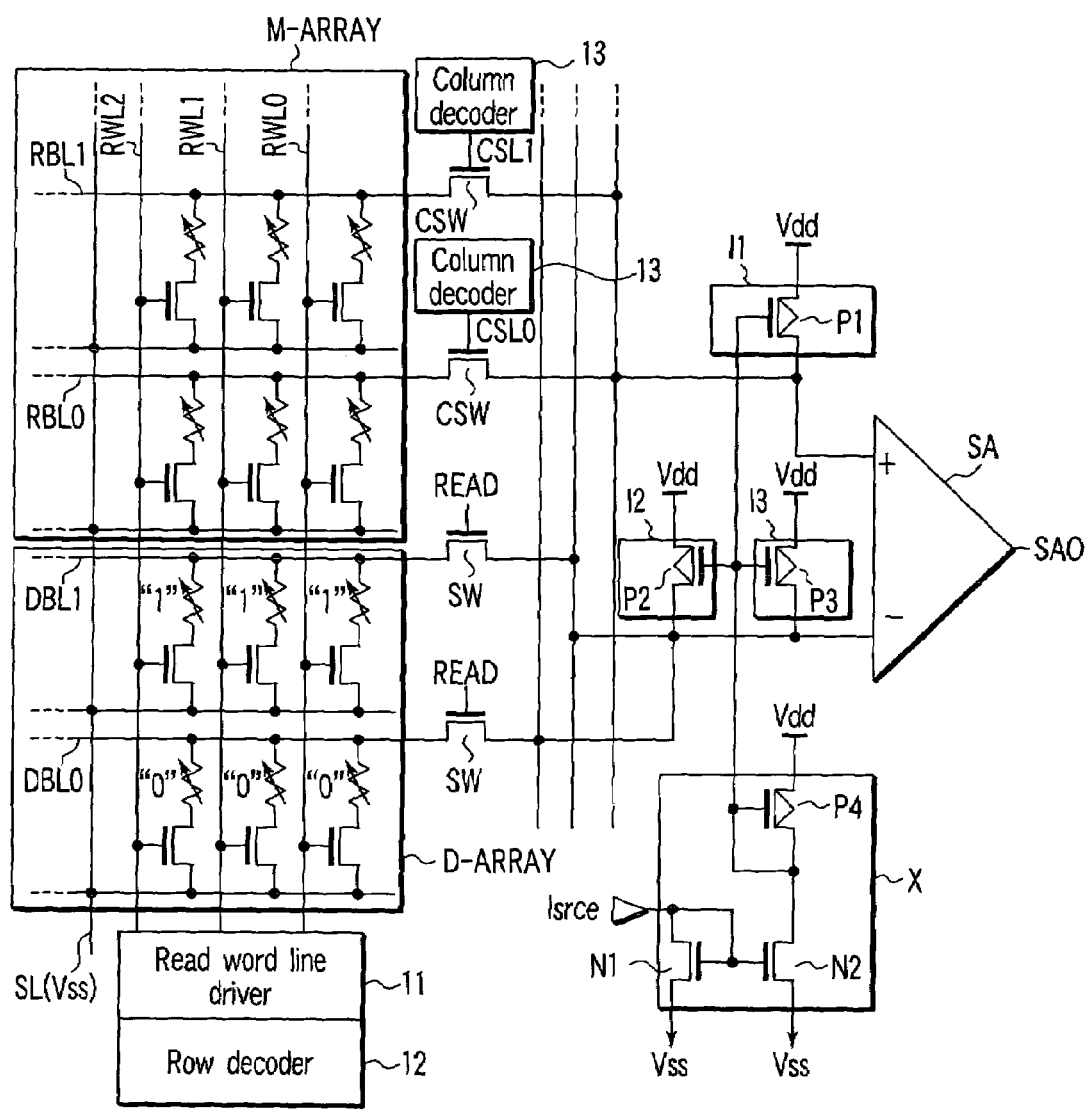
FIG. 2 is a circuit diagram showing an example of a current source circuit.

FIG. 2 shows an example of a current source circuit including the current sources I1, I2 and I3.

Isrce is an output current output from, for example, a BGR circuit. This current Isrce flows to a transistor P4 via a current mirror circuit (transistors N1 and N2) in an area X.

Furthermore, the transistor P4 and transistors P1, P2 and P3 that constitute the current sources I1, I2 and I3 constitute the current mirror circuit, thus the current Isrce also flows through the transistors P1, P2 and P3.

Therefore, during read, the selected memory cell is supplied with the bias current Isrce. On the other hand, during read, the selected two reference cells ("0" cell and "1" cell) are supplied with the bias current Isrce×2.

Here, in order to cause the bias current to depend on temperature without depending on an external power supply potential Vdd, the BGR circuit can be modified such that its output current Isrce has temperature dependency.

BGR Circuit

Figure 3:
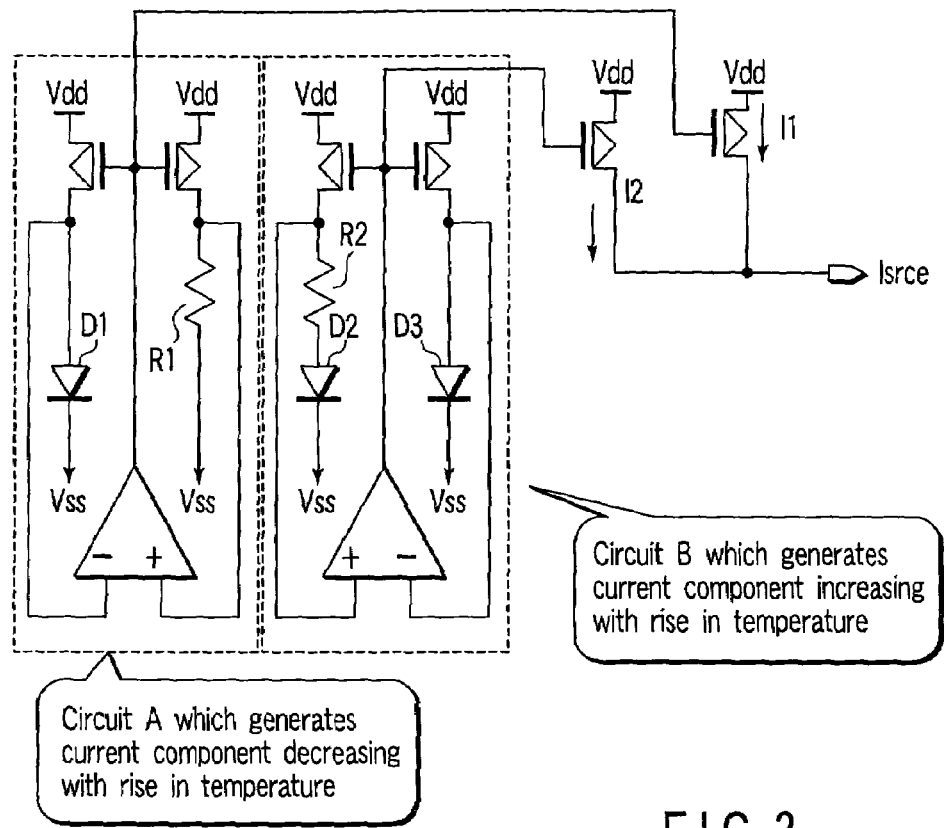
FIG. 3 is a circuit diagram showing an example of a BGR circuit.

Therefore, a standard BGR circuit will first be considered. FIG. 3 shows an example of the BGR circuit.

Since the BGR circuit usually generates an output current Isrce that does not have temperature dependency, the BGR circuit comprises a circuit A to generate a current component I1 which decreases with a rise in temperature, and a circuit B to generate a current component I2 which increases with the rise in temperature.

Figure 4:
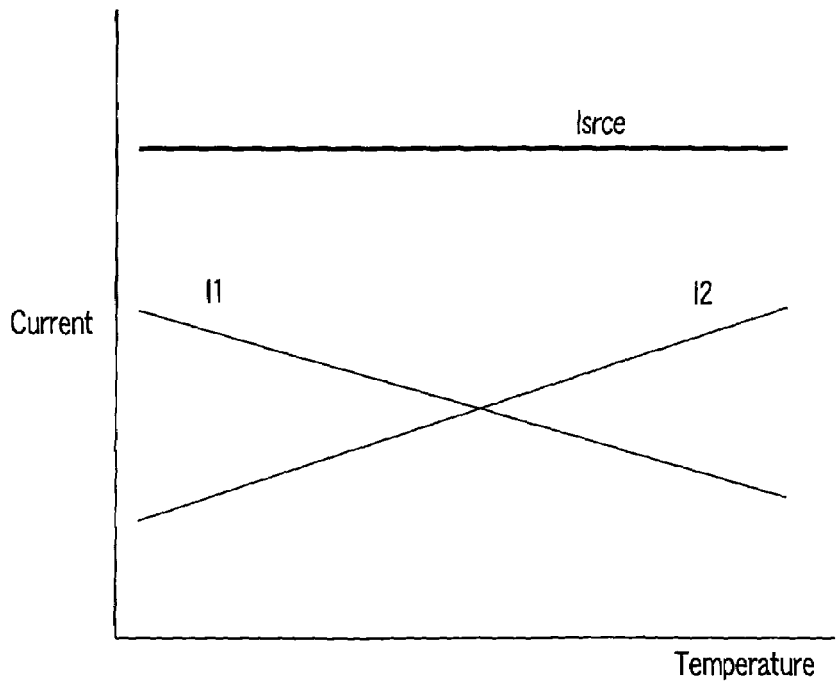
FIG. 4 is a diagram showing characteristics of the BGR circuit of FIG. 3.

By adding together the current components I1 and I2 generated by the two circuits A and B, it is possible to generate the output current Isrce which does not depend on the external power supply potential Vdd and temperature, for example, as shown in FIG. 4.

If an anode potential of a diode D1 is Vd and a resistance value of a resistor R1 is r1, the current component I1 which decreases with the rise in temperature can be expressed as $$I1 = Vd/r1$$

due to the effect of a feedback circuit.

Because the anode potential Vd decreases at a high temperature, the current I1 decreases with temperature rise.

Furthermore, if a potential difference between anodes of two diodes D2 and D3 is ΔVd and a resistance value of a resistor R2 is r2, the current component I2 which increases with the rise in temperature can be expressed as $$I2 = \Delta Vd/r2$$

due to the effect of the feedback circuit.

Because the potential difference ΔVd between the anodes increases at a high temperature, the current I2 increases with temperature rise.

Here, the current components I1 and I2 can be changed on the basis of an area ratio among the diodes D1, D2 and D3 and a resistance ratio between the resistors R1 and R2. More specifically, by adjusting the area ratio and the resistance ratio, the output current Isrce can have temperature dependency.

BGR Circuit (Improvement Example 1)

Figure 5:
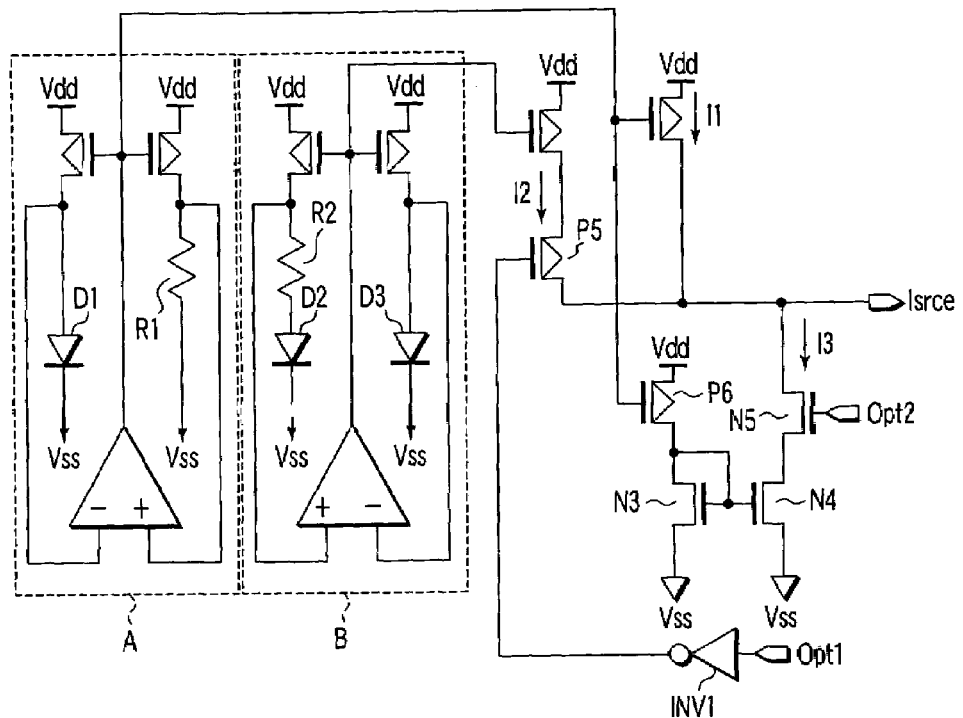
FIG. 5 is a circuit diagram showing an improvement example 1 of the BGR circuit.

FIG. 5 shows an improvement example 1 of the BGR circuit which generates the output current Isrce having temperature dependency.

In the BGR circuit of the present example, a circuit comprising P-channel MOS transistors P5 and P6, N-channel MOS transistors N3 to N5, and an inverter INV1 is further added to the BGR circuit of FIG. 3.

According to the present example, temperature dependency of the output current Isrce can be adjusted on the basis of control signals Opt1 and Opt2.

The transistor P5 controls the size or supply/cutoff of the current component I2 on the basis of the control signal Opt1. The size or supply/cutoff of the current component I2 is controlled by the control signal Opt1 so that temperature dependency (such as inclination of a straight line and magnitude of an absolute value) of the output current Isrce can be freely controlled, for example, as shown in FIG. 6.

Furthermore, the circuit comprising the transistors P6 and N3 to N5 generates a new current component I3. This circuit controls the size or supply/cutoff of the current component I3 on the basis of the control signal Opt2. This makes it possible to freely control temperature dependency (such as the inclination of the straight line and the magnitude of the absolute value) of the output current Isrce, for example, as shown in FIG. 6.

The current component I3 is dependent on temperature characteristics of the circuit A similarly to the current component I1. Therefore, the current components I1 and I3 both have temperature dependency to decrease with the rise in temperature, for example, as shown in FIG. 6. However, the inclination of the straight line and the magnitude of the absolute value that indicate temperature dependency are different in the current components I1 and I3 due to adjustment of size of the transistors.

Figure 6:
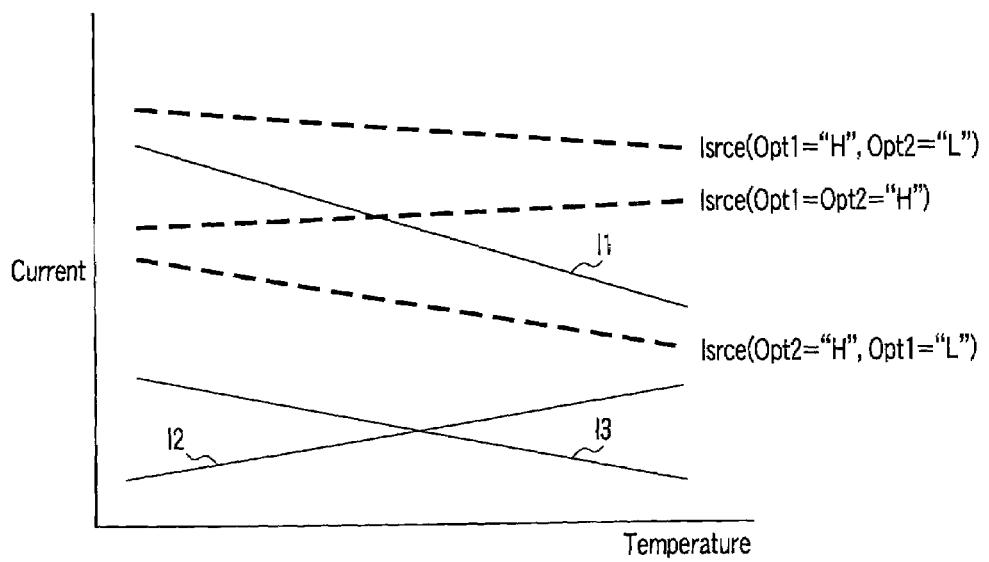
FIG. 6 is a diagram showing the characteristics of the BGR circuit of FIG. 5.

Because the current component I2 is dependent on temperature characteristics of the circuit B, the current component I2 has temperature dependency to increase with the rise in temperature, for example, as shown in FIG. 6.

A specific example will be described.

It is assumed that there are two kinds "H" and "L" in the control signals Opt1 and Opt2.

For example, the area ratio of the diodes and transistors and the resistance ratio of the resistors are adjusted so that the currents I1, I2 and I3 as shown in FIG. 6 will be generated.

At this point, if the control signal Opt1 is set to "H" and the control signal Opt2 is set to "L", the transistor P5 is turned on, and the output current Isrce which is a total of the current components I1 and I2 is generated. Therefore, the current Isrce will have temperature dependency to decrease with the rise in temperature, as shown in FIG. 6.

"The rate of decrease of the current Isrce with the rise in temperature (inclination of the straight line)" in this case is lower than "the rate of decrease of the current Isrce with the rise in temperature (inclination of the straight line indicating the current I1)" in the case where the output current Isrce is generated only by the current component I1 (Opt1=Opt2="L").

Furthermore, if the control signal Opt2 is set to "H" and the control signal Opt1 is set to "L", the transistor P5 is turned off and the transistor N5 is turned on, and the output current Isrce in which the current component I3 is subtracted from the current component I1 is generated. This current Isrce will have temperature dependency to decrease with the rise in temperature, as shown in FIG. 6.

"The intensity of the output current Isrce (magnitude of the absolute value of the straight line)" in this case is lower than "the intensity of the output current Isrce (magnitude of the absolute value of the straight line indicating the current I1)" in the case where the output current Isrce is generated only by the current component I1 (Opt1=Opt2="L").

Furthermore, if both the control signals Opt1 and Opt2 are set to "H", the transistors P5 and N5 are both turned on, and the output current Isrce in which the current component I3 is subtracted from the total of the current components I1 and I2 is generated. This current Isrce will have temperature dependency to increase with the rise in temperature, as shown in FIG. 6.

"The rate of increase of the current Isrce with the rise in temperature (inclination of the straight line)" in this case is lower than "the rate of increase of the current Isrce with the rise in temperature (inclination of the straight line indicating the current I2)" in the case where the output current Isrce is generated only by the current component I2.

BGR Circuit (Improvement Example 2)

Figure 7:
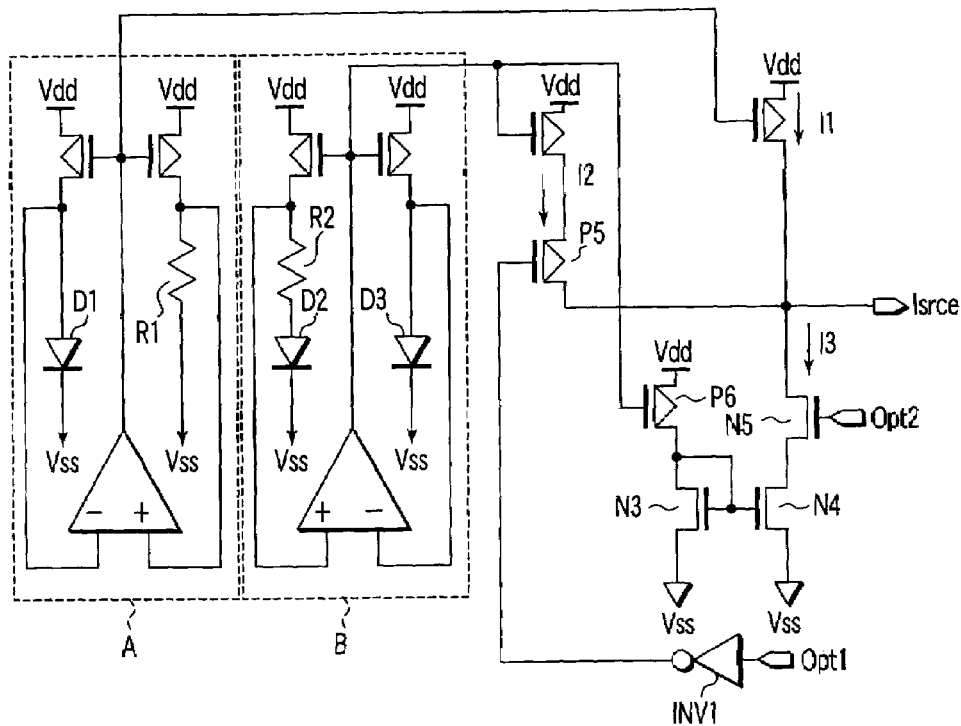
FIG. 7 is a circuit diagram showing an improvement example 2 of the BGR circuit.

FIG. 7 shows an improvement example 2 of the BGR circuit which generates the output current Isrce having temperature dependency.

In the BGR circuit of the present example, the circuit comprising the P-channel MOS transistors P5 and P6, the N-channel MOS transistors N3 to N5, and the inverter INV1 is further added to the BGR circuit of FIG. 3.

Also in the present example, temperature dependency of the output current Isrce can be adjusted on the basis of the control signals Opt1 and Opt2.

However, in the present example, components are connected differently from those in the BGR circuit of FIG. 5 (improvement example 1), and therefore, temperature dependency of the output current Isrce is controlled in a different manner.

Figure 8:
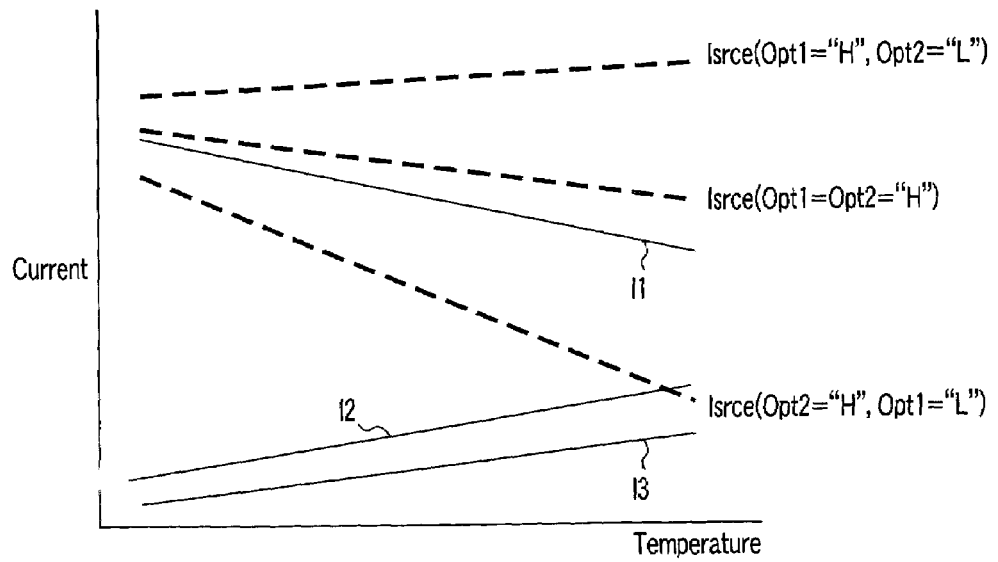
FIG. 8 is a diagram showing the characteristics of the BGR circuit of FIG. 7.

The transistor P5 controls the size or supply/cutoff of the current component I2 on the basis of the control signal Opt1. The size or supply/cutoff of the current component I2 is controlled by the control signal Opt1 so that temperature dependency (such as the inclination of the straight line and the magnitude of the absolute value) of the output current Isrce can be freely controlled, for example, as shown in FIG. 8.

Furthermore, the circuit comprising the transistors P6 and N3 to N5 generates the new current component I3. This circuit controls the size or supply/cutoff of the current component I3 on the basis of the control signal Opt2. This makes it possible to freely control temperature dependency (such as the inclination of the straight line and the magnitude of the absolute value) of the output current Isrce, for example, as shown in FIG. 6.

The current component I3 is dependent on temperature characteristics of the circuit B similarly to the current component I2. Therefore, the current components I2 and I3 both have temperature dependency to increase with the rise in temperature, for example, as shown in FIG. 8. However, the inclination of the straight line and the magnitude of the absolute value that indicate temperature dependency are different in the current components I2 and I3 due to the adjustment of size of the transistors.

Because the current component I1 is dependent on temperature characteristics of the circuit A, the current component I1 has temperature dependency to decrease with the rise in temperature, for example, as shown in FIG. 6.

A specific example will be described.

It is assumed that there are the two kinds "H" and "L" in the control signals Opt1 and Opt2.

Moreover, for example, the area ratio of the diodes and transistors and the resistance ratio of the resistors are adjusted so that the currents I1, I2 and I3 as shown in FIG. 8 will be generated.

At this point, if the control signal Opt1 is set to "H" and the control signal Opt2 is set to "L", the transistor P5 is turned on, and the output current Isrce which is the total of the current components I1 and I2 is generated. Therefore, the current Isrce will have temperature dependency to increase with the rise in temperature, as shown in FIG. 8.

"The rate of increase of the current Isrce with the rise in temperature (inclination of the straight line)" in this case is lower than "the rate of increase of the current Isrce with the rise in temperature (inclination of the straight line indicating the current I2)" in the case where the output current Isrce is generated only by the current component I2.

Furthermore, if the control signal Opt2 is set to "H" and the control signal Opt1 is set to "L", the transistor P5 is turned off and the transistor N5 is turned on, and the output current Isrce in which the current component I3 is subtracted from the current component I1 is generated. This current Isrce will have temperature dependency to decrease with the rise in temperature, as shown in FIG. 8.

"The rate of decrease of the current Isrce with the rise in temperature (inclination of the straight line)" in this case is higher than "the rate of decrease of the current Isrce with the rise in temperature (inclination of the straight line indicating the current I2)" in the case where the output current Isrce is generated only by the current component I1.

Furthermore, if both the control signals Opt1 and Opt2 are set to "H", the transistors P5 and N5 are both turned on, and the output current Isrce in which the current component I3 is subtracted from the total of the current components I1 and I2 is generated. This current Isrce will have temperature dependency to decrease with the rise in temperature, as shown in FIG. 8.

"The rate of decrease of the current Isrce with the rise in temperature (inclination of the straight line)" in this case is lower than "the rate of decrease of the current Isrce with the rise in temperature (inclination of the straight line indicating the current I2)" in the case where the output current Isrce is generated only by the current component I1.

When the BGR circuit according the present example is used, the bias current Isrce can be decreased with the rise in temperature, for example. The present example is effective when Vh increases in accordance with the rise in temperature.

Other BGR Circuits (Improvement Examples 3 to 5)

Other BGR circuits will be simply described.

In the circuits described below, the line indicating temperature dependency of the bias current Isrce has one or more bending points.

In the examples below, temperature dependency of the output current Isrce can not be adjusted on the basis of the control signals, but it is naturally possible to combine the techniques of the improvement examples 1 and 2 (FIG. 5 and FIG. 9) to have a configuration such that temperature dependency can be adjusted.

Figure 9:
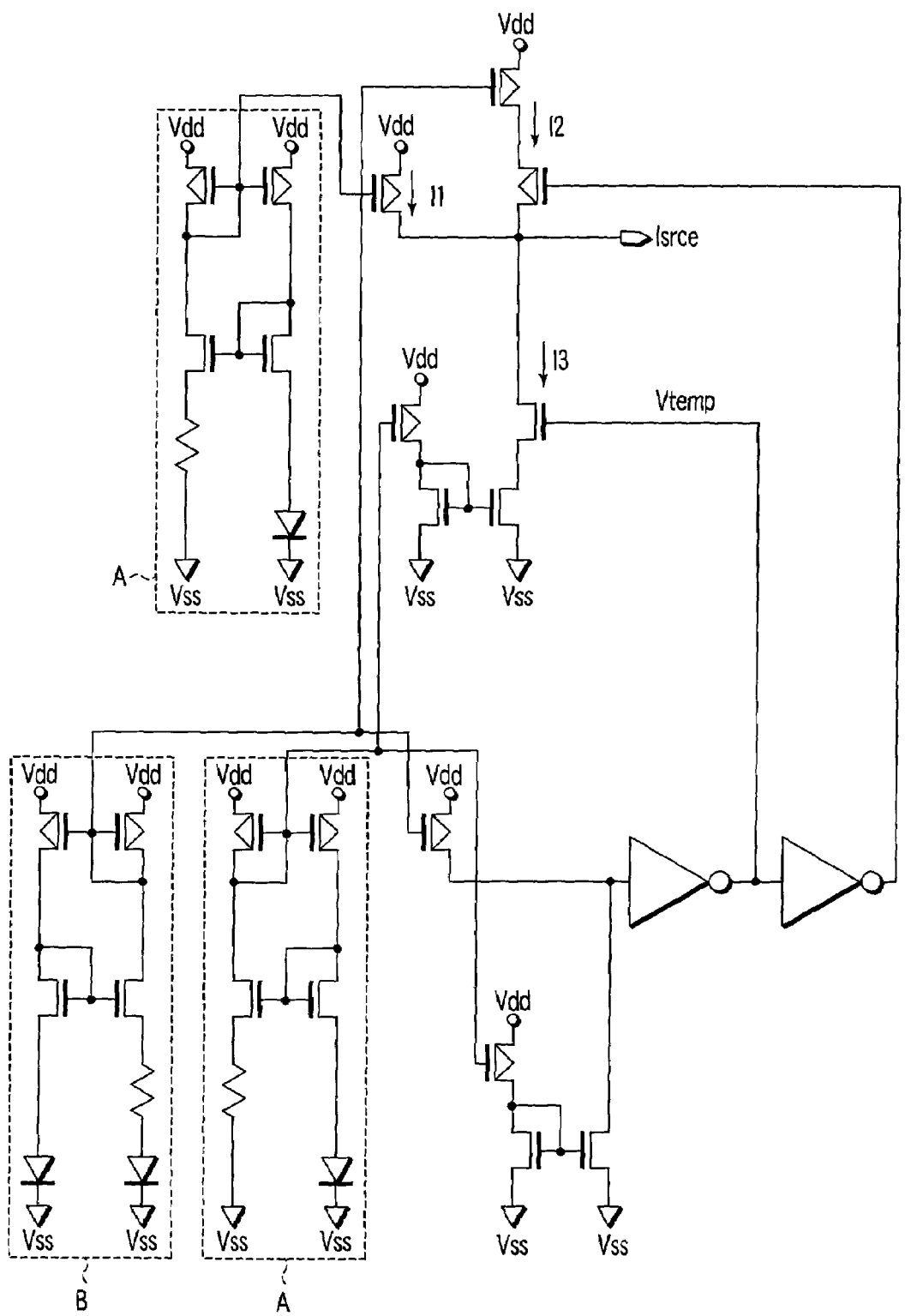
FIG. 9 is a circuit diagram showing an improvement example 3 of the BGR circuit.

FIG. 9 shows an improvement example 3 of the BGR circuit which generates the output current Isrce having temperature dependency.

Figure 10:
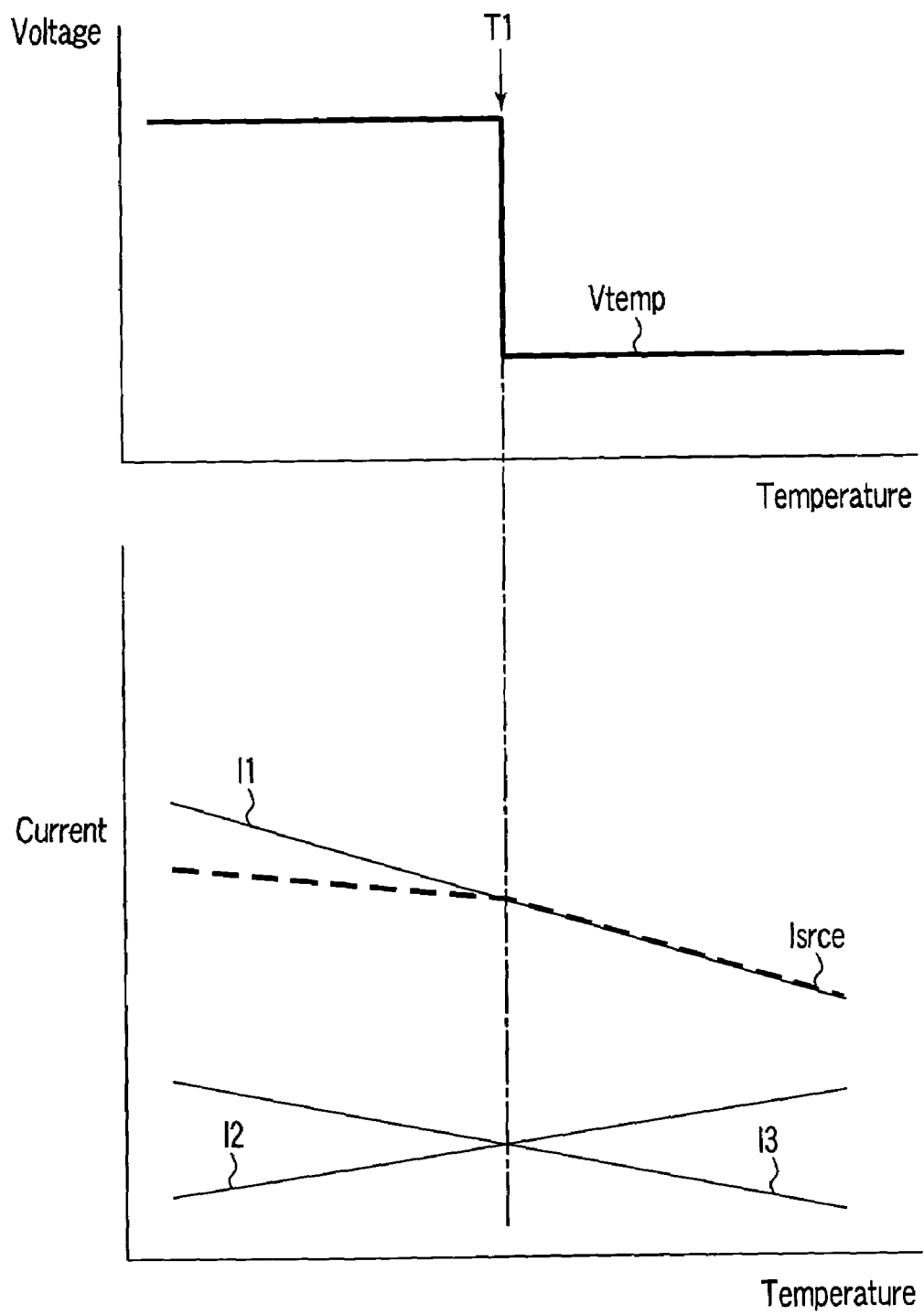
FIG. 10 is a diagram showing the characteristics of the BGR circuit of FIG. 9.

The BGR circuit in the present example is characterized in that the line indicating temperature dependency of the bias current Isrce has one or more bending points as shown in FIG. 10.

From a temperature T1, Vtemp is "H" at a temperature lower than temperature T1, and a result of subtracting the current component I3 from the total of the current components I1 and I2 will be the output current Isrce.

Furthermore, the Vtemp is "L" at a temperature higher than temperature T1, and only the current component I1 will be the output current Isrce.

Figure 11:
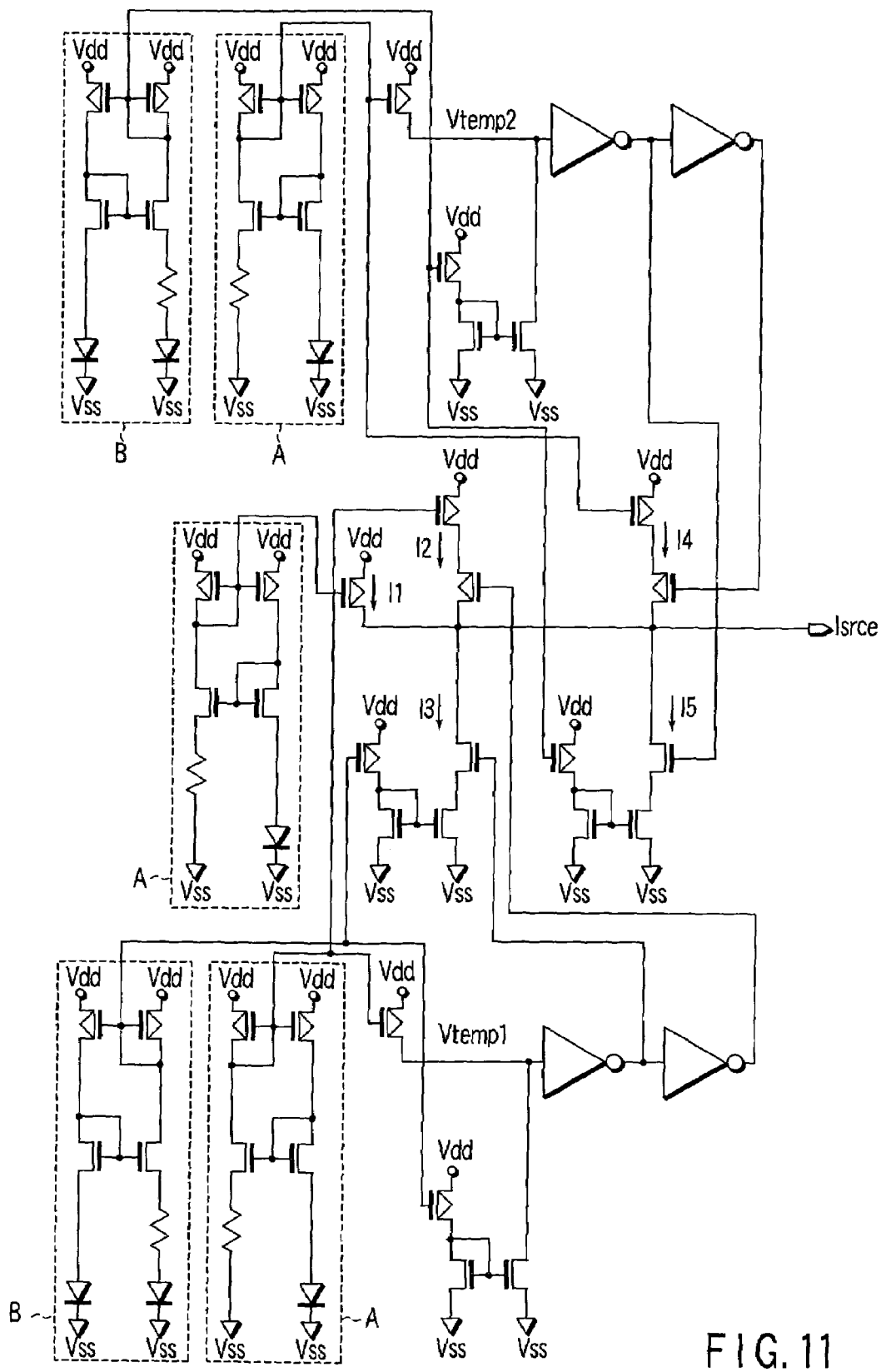
FIG. 11 is a circuit diagram showing an improvement example 4 of the BGR circuit.

FIG. 11 shows an improvement example 4 of the BGR circuit which generates the output current Isrce having temperature dependency.

Figure 12:
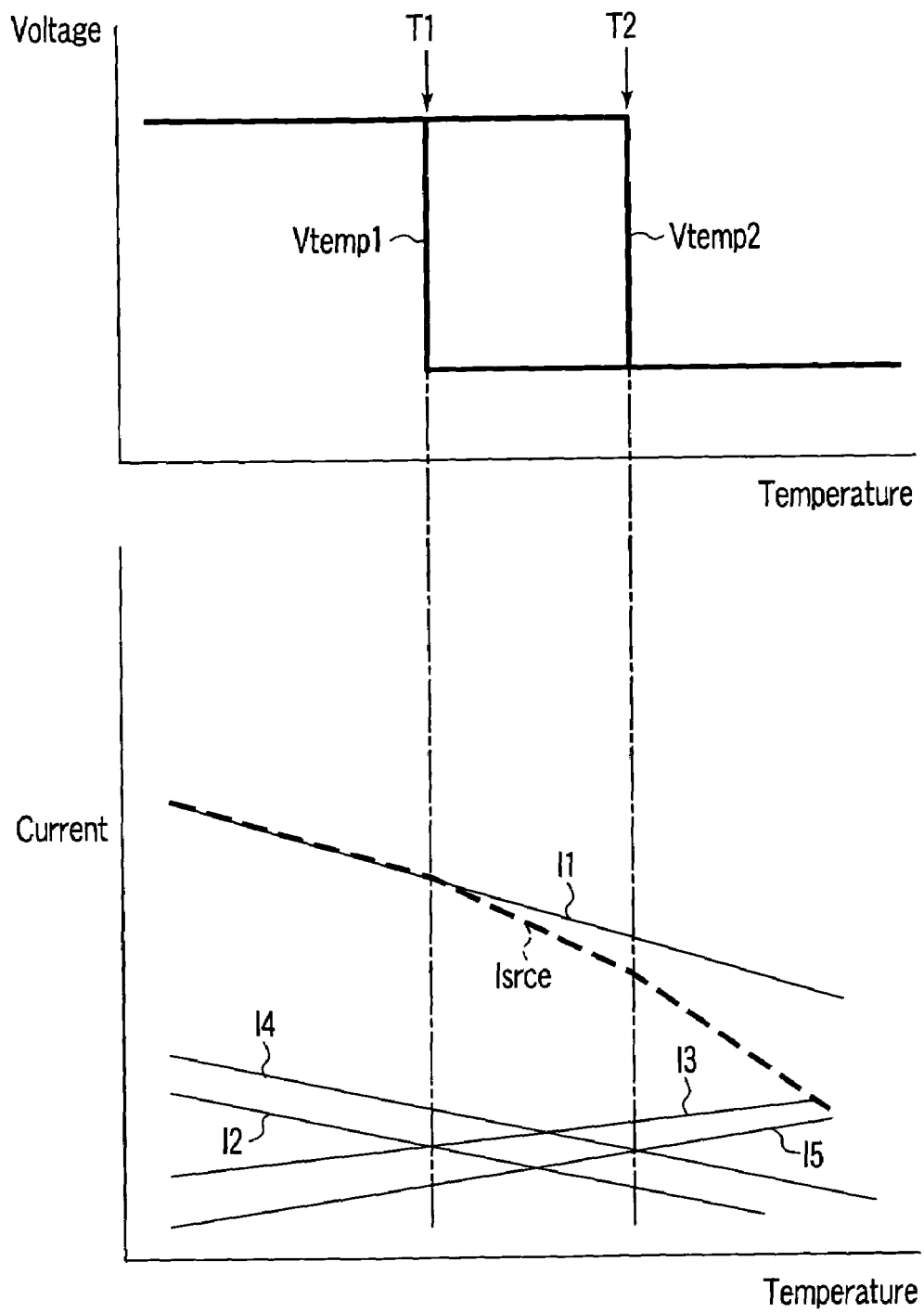
FIG. 12 is a diagram showing the characteristics of the BGR circuit of FIG. 11.

The BGR circuit in the present example is characterized in that the line indicating temperature dependency of the bias current Isrce has two bending points as shown in FIG. 12.

From temperature T1, Vtemp1 and Vtemp2 are both "H" at a temperature lower than temperature T1, and only the current component I1 will be the output current Isrce.

Moreover, the Vtemp1 is "L" and the Vtemp2 is "H" at a temperature in a range higher than temperature T1 and lower than temperature T2, and a result of subtracting the current component I3 from the total of the current components I1 and I2 will be the output current Isrce.

Furthermore, from temperature T2, the Vtemp1 and Vtemp2 are both "L" at a temperature higher than temperature T2, and a result of subtracting the total of the current components I3 and I5 from the total of the current components I1, I2 and I4 will be the output current Isrce.

Figure 13:
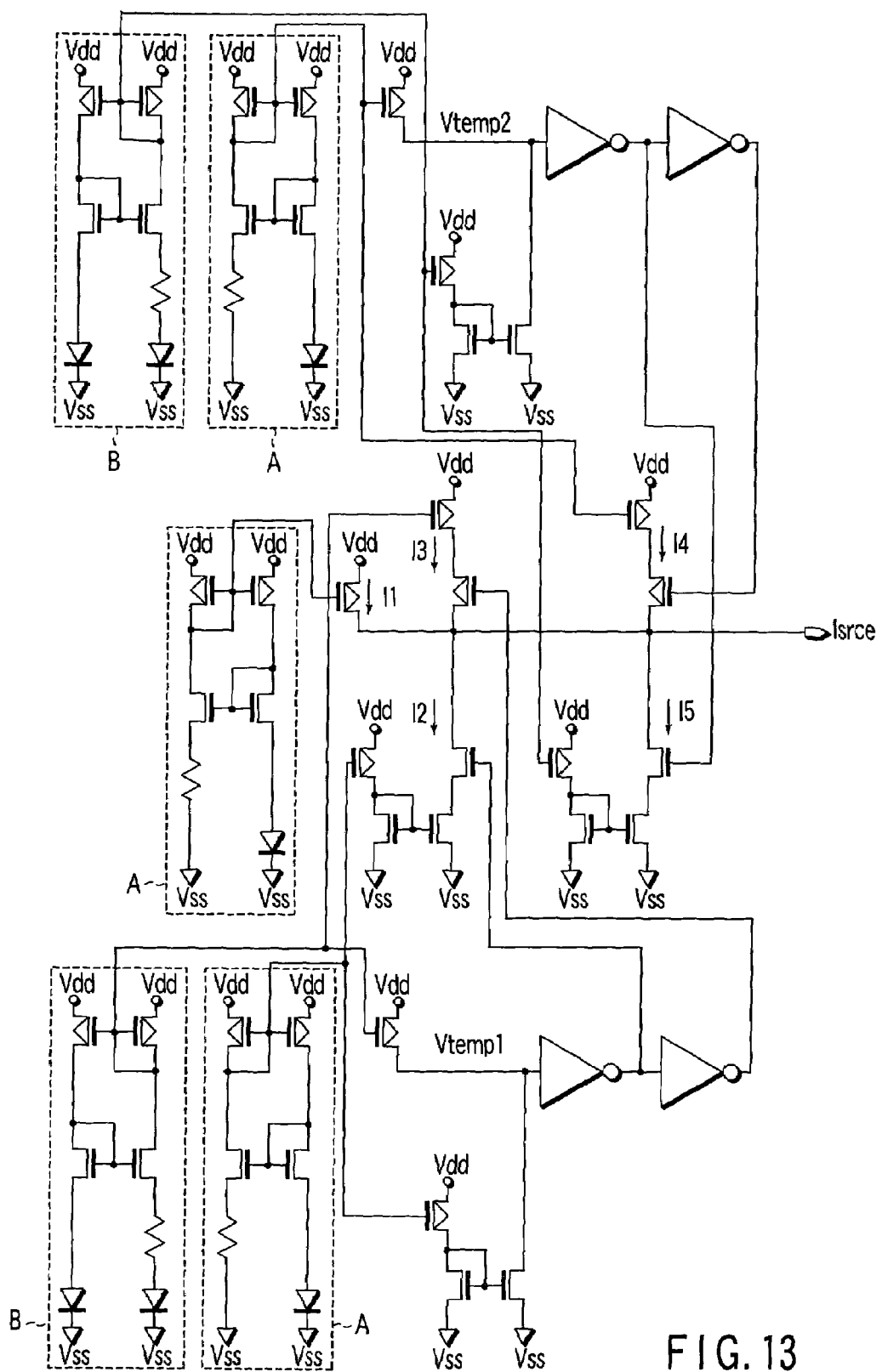
FIG. 13 is a circuit diagram showing an improvement example 5 of the BGR circuit.

FIG. 13 shows an improvement example 5 of the BGR circuit which generates the output current Isrce having temperature dependency.

Figure 14:
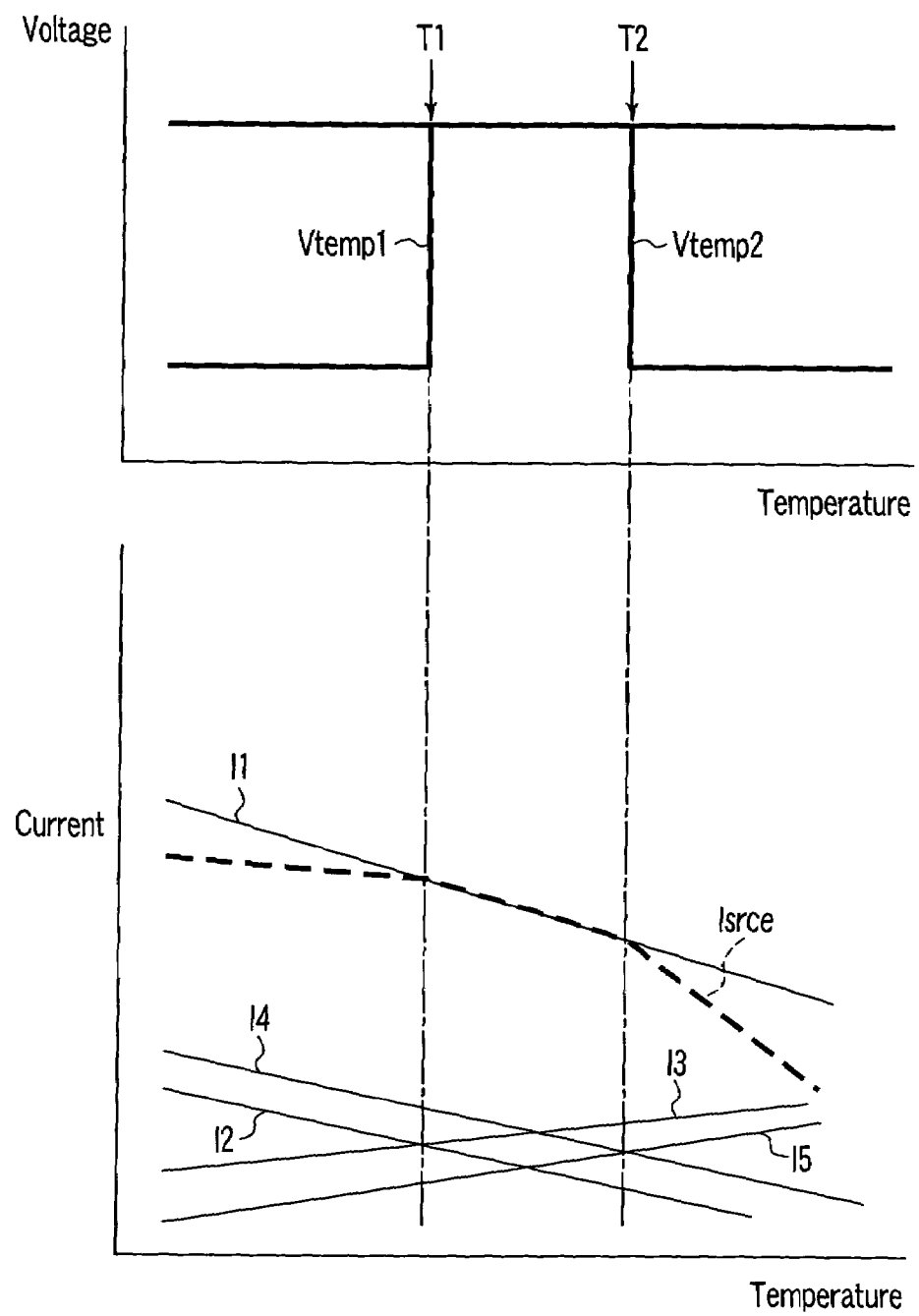
FIG. 14 is a diagram showing the characteristics of the BGR circuit of FIG. 13.

The BGR circuit in the present example is also characterized in that the line indicating temperature dependency of the bias current Isrce has two bending points as shown in FIG. 14.

From temperature T1, the Vtemp1 is "L" and the Vtemp2 is "H" at a temperature lower than temperature T1, and a result of subtracting the current component I2 from the total of the current components I1 and I3 will be the output current Isrce.

Furthermore, the Vtemp1 and Vtemp2 are both "H" at a temperature in a range higher than temperature T1 and lower than temperature T2, and only the current component I1 will be the output current Isrce.

Furthermore, from temperature T2, the Vtemp1 is "H" and the Vtemp2 is "L" at a temperature higher than temperature T2, and a result of subtracting the current component I5 from the total of the current components I1 and I4 will be the output current Isrce.

[3] Row Decoder and Read Word Line Driver

Figure 15:
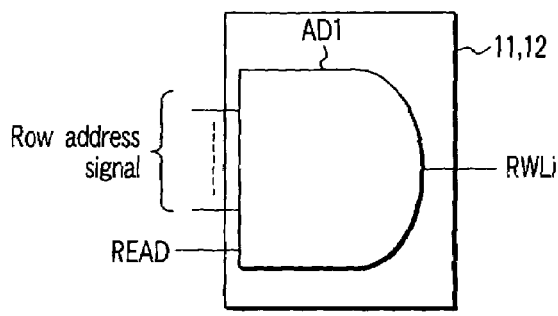
FIG. 15 is a circuit diagram showing an example of a row decoder and a read word line driver.

FIG. 15 shows a circuit example of the row decoder and the read word line driver.

In the present example, an AND circuit AD1 has functions of the read word line driver 11 and the row decoder 12 of FIG. 1. The AND circuit AD1 drives a read word line RWLi when receiving a row address signal and a read signal READ.

During read, the read signal READ is "H", and all bits of the row address signal are "H" in the selected row. Therefore, only the read word line RWL1 belonging to the selected row is "H".

[4] Column Decoder

Figure 16:
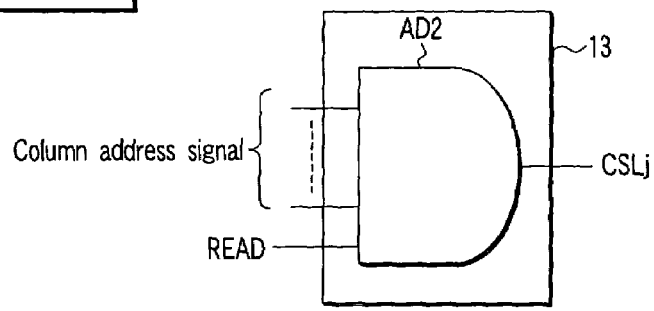
FIG. 16 is a circuit diagram showing an example of a column decoder.

FIG. 16 shows a circuit example of the column decoder.

In the present example, an AND circuit AD2 is equivalent to column decoder 13 of FIG. 1. The AND circuit AD2 drives a column selected line CSLj when receiving a column address signal and the read signal READ.

During read, the read signal READ is "H", and all bits of the column address signal are "H" in the selected column. Therefore, only the column selected line CSLj belonging to the selected column is "H".

[5] Summary

As described above, according to the read circuit of the first embodiment, the bias current/voltage given to the MTJ element during read depends on temperature without depending on the power supply potential Vdd, thereby enabling a read margin to be enhanced.

(2) Second Embodiment

In the present embodiment, the value of a clamp potential Vclmp is adjusted so that, during read, the potential difference produced between both ends of the MTJ elements of the memory cell and the reference cell will be Vh (the voltage at which the MR ratio will be half of the MR ratio MR0 during bias application).

The clamp potential Vclmp serves to limit the value of the bias current/voltage given to the MTJ element during read, and temperature dependency is given to the clamp potential Vclmp.

More specifically, in the present embodiment, for example, when Vh decreases with the rise in temperature, the clamp potential Vclmp also decreases with the rise in temperature.

[1] Read Circuit

FIG. 17 shows the read circuit according to a second embodiment.

The memory cell array M-ARRAY is constituted of the one transistor/one MTJ type memory cells.

The sources of the transistors constituting the memory cell are connected to the source line (ground potential Vss) SL, and the drains thereof are connected to the MTJ elements, and the gates thereof are connected to the read word lines RWL0, RWL1 RWL2, . . . . One end of the MTJ element is connected to the read bit line RBL0, RBL1, . . . .

One end of the read word line RWL0, RWL1 RWL2, . . . is connected to the read word line driver 11. During read, because one row is selected by the row decoder 12, the read word line driver 11 drives the read word line belonging to the selected row on the basis of the decoding result by the row decoder 12.

The read bit line RBL0, RBL1, . . . is connected to the noninverting terminal of the differential amplifier as the sense amplifier SA via the column selecting switch CSW and a transfer gate TG. The column selecting switch CSW is turned on/off under the control of the output signal CSL0, CSL1, . . . of the column decoders 13.

The transfer gate TG is controlled by an output signal of a differential amplifier DI. The clamp potential Vclmp is input to a noninverting terminal of the differential amplifier DI, and a potential of one read bit line selected from the read bit lines RBL0, RBL1, . . . is input to an inverting terminal thereof.

The current source I1 supplies the bias current to the MTJ element of the selected memory cell via the transfer gate TG during read. The bias current flows through the MTJ element, so that the potential of the noninverting terminal of the differential amplifier as the sense amplifier SA will have a value corresponding to the data in the MTJ element.

The reference cell array D-ARRAY is constituted of the one transistor/one MTJ type memory cells, similarly to the memory cell array M-ARRAY.

The sources of the transistors constituting the reference cell are connected to the source line (ground potential Vss) SL, and the drains thereof are connected to the MTJ elements, and the gates thereof are connected to the read word lines RWL0, RWL1 RWL2, . . . . One end of the MTJ element is connected to the reference bit line DBL0, DBL1, . . . .

The reference bit line DBL0, DBL1, . . . is connected to the inverting terminal of the differential amplifier as the sense amplifier SA via the selecting switch SW and the transfer gate TG. The selecting switch SW is turned on/off under the control of a read signal READ.

The transfer gate TG is controlled by the output signal of the differential amplifier DI. The clamp potential Vclmp is input to the noninverting terminal of the differential amplifier DI, and the potential of the reference bit line DBL0, DBL1, . . . is input to the inverting terminal thereof.

Here, during read, because the read signal READ is "H", the reference potential necessary for reading data is generated by the reference cell.

For example, the state of the MTJ elements of the reference cells connected to the reference bit line DBL0 is all set to "0" (antiparallel state), and the state of the MTJ elements of the reference cells connected to the reference bit line DBL1 is all set to "1" (parallel state).

In this case, during read, if the bias current is supplied by current sources I2 and I3 to the MTJ element of the reference cell belonging to the selected row, the reference potential necessary for reading is input to the inverting terminal of the differential amplifier as the sense amplifier SA.

According to the examples of the present invention, in the read circuit as described above, the value of the clamp potential Vclmp is adjusted so that, during read, the potential difference (bias potential) produced between both ends of the MTJ elements of the memory cell and the reference cell will be Vh.

[2] Current Source Circuit

Figure 18:
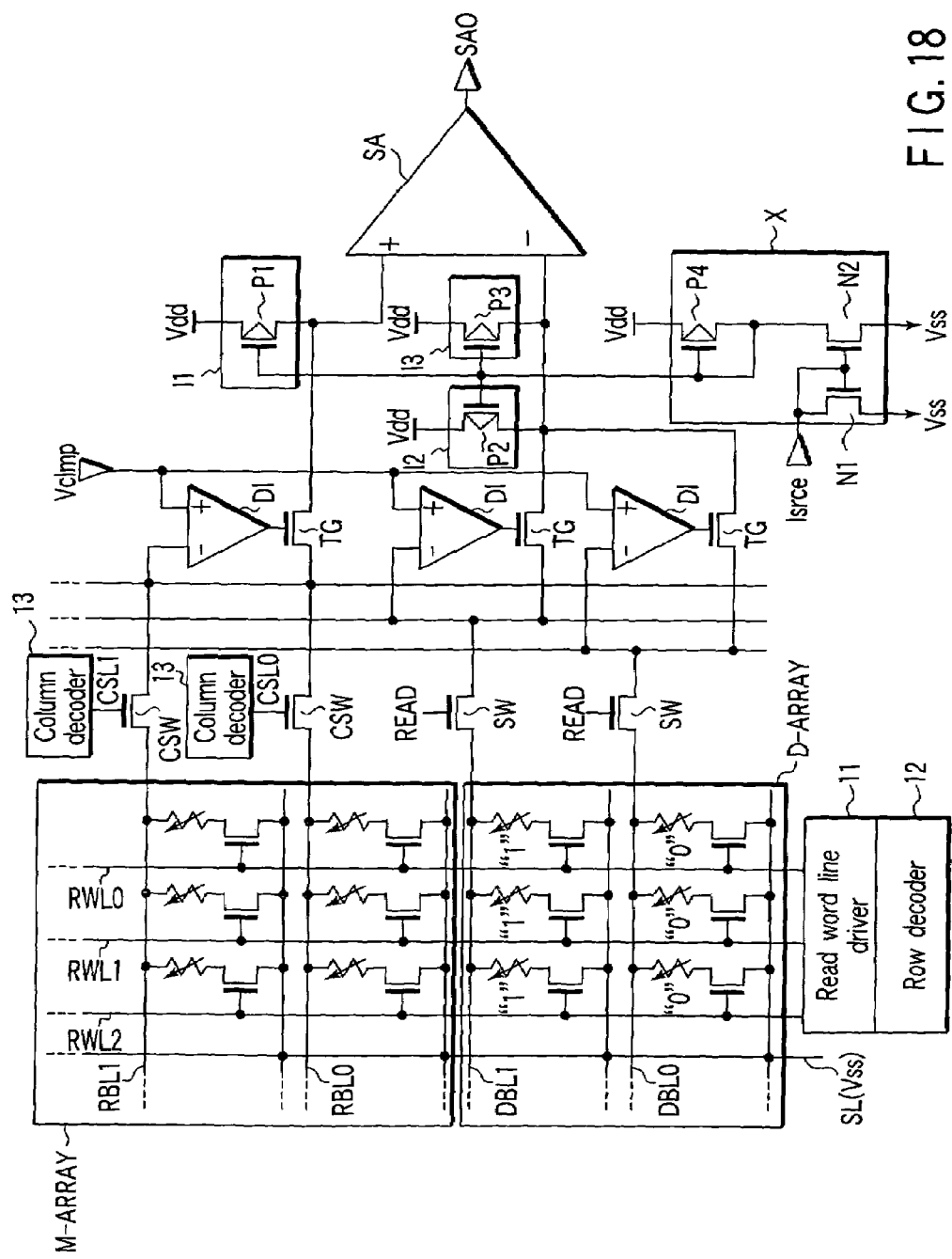
FIG. 18 is a circuit diagram showing an example of the current source circuit.

FIG. 18 shows an example of the current source circuit including the current sources I1, I2 and I3 of FIG. 17.

Isrce is the output current which is output from, for example, the BGR circuit. The BGR circuit used here generates the output signal Isrce that does not have temperature dependency as shown in FIG. 3, which is different from the first embodiment. In other words, Isrce is the constant current which is not dependent on temperature in the present example.

The constant current Isrce flows to the transistor P4 via the current mirror circuit (transistors N1 and N2) in the area X.

Furthermore, the transistor P4 and the transistors P1, P2 and P3 that constitute the current sources I1, I2 and I3 constitute the current mirror circuit, so that the constant current Isrce also flows through the transistors P1, P2 and P3.

Therefore, during read, the selected memory cell is supplied with the bias current in which the constant current Isrce is limited by the clamp potential Vclmp. On the other hand, during read, the selected two reference cells ("0" cell and "1" cell) are supplied with the bias current in which the constant current Isrce×2 are limited by the clamp potential Vclmp.

Here, in order to cause the bias current to depend on temperature without depending on the external power supply potential Vdd, the BGR circuit as shown in, for example, FIG. 5, FIG. 7, FIG. 9, FIG. 11 or FIG. 13 can be used as a circuit to generate the clamp potential Vclmp.

Figure 19:
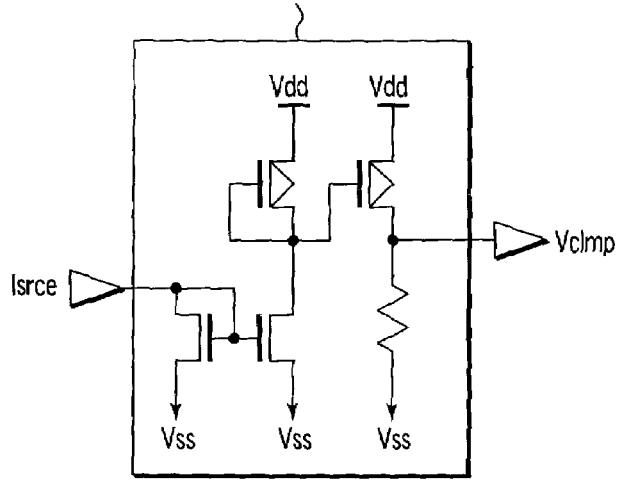
FIG. 19 is a circuit diagram showing an example of a current/voltage converting circuit.

More specifically, the output current Isrce of the BGR circuit as shown in, for example, FIG. 5, FIG. 7, FIG. 9, FIG. 11 or FIG. 13 is converted into a voltage by a current/voltage converting circuit 14 as shown in FIG. 19, and the clamp potential Vclmp is generated from this voltage.

In this case, for example, if the current Isrce is set to decrease with the rise in temperature, the clamp potential Vclmp also decreases with the rise in temperature, and if the current Isrce is set to increase with the rise in temperature, the clamp potential Vclmp also increases with the rise in temperature.

Figure 20:
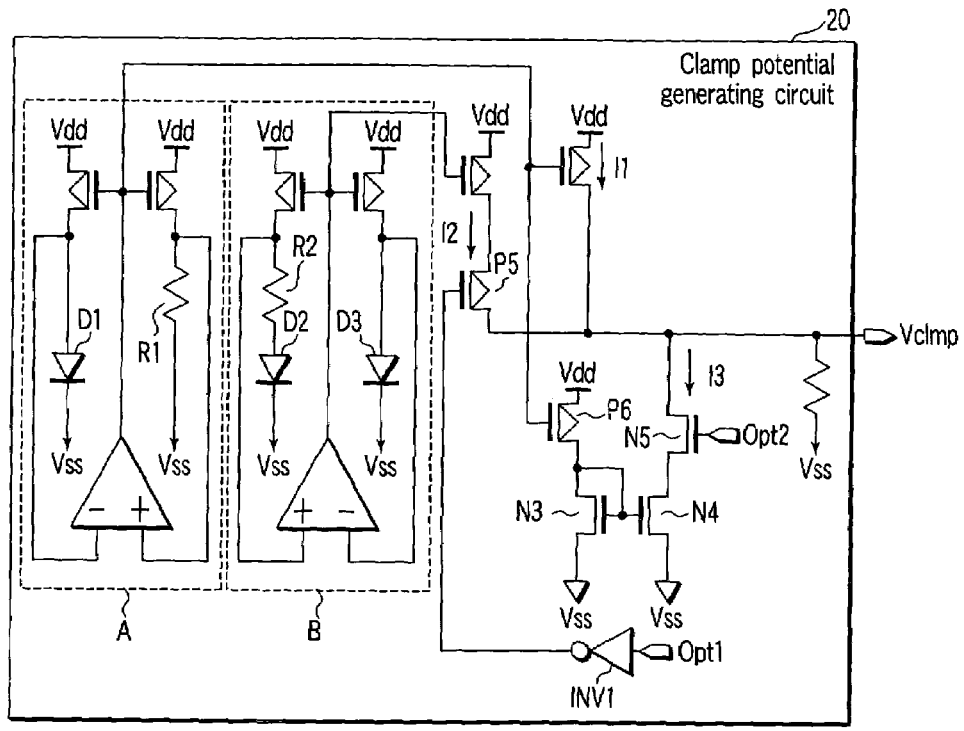
FIG. 20 is a circuit diagram showing an example of a clamp potential generating circuit using the BGR circuit.

Furthermore, in order to cause the bias current to depend on temperature without depending on the external power supply potential Vdd, a clamp potential generating circuit 20 as shown in, for example, FIG. 20 may be used as the circuit to generate the clamp potential Vclmp.

This clamp potential generating circuit 20 is a circuit to which the BGR circuit of FIG. 5 is applied and in which a resistive element for converting the output current of the BGR circuit into a voltage (clamp potential Vclmp) is connected to an output terminal of the BGR circuit of FIG. 5.

Figure 21:
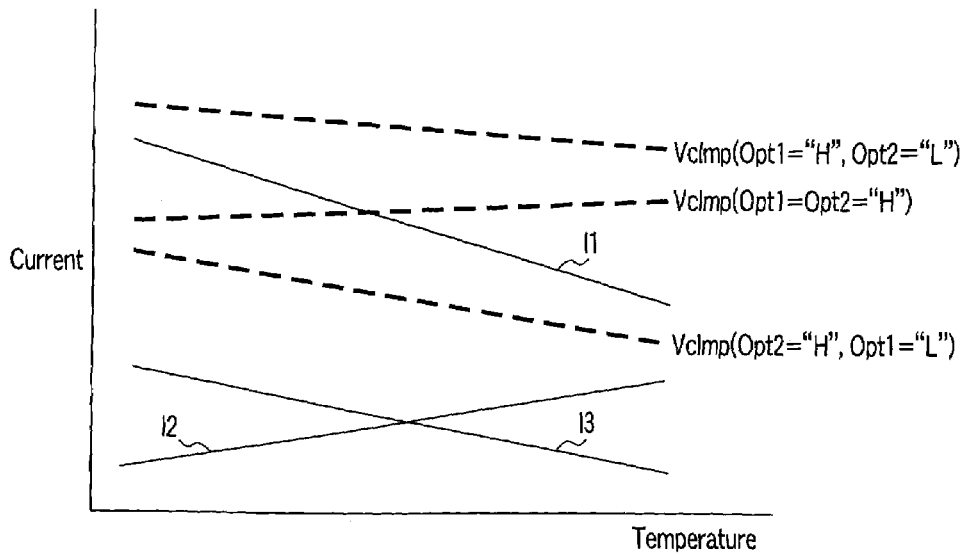
FIG. 21 is a diagram showing the characteristics of the clamp potential generating circuit of FIG. 20.

In this case, the clamp potential Vclmp can be decreased with the rise in temperature, and also, the clamp potential Vclmp can be increased with the rise in temperature, for example, as shown in FIG. 21.

It is to be noted that the resistive element may connected to the output terminal of the BGR circuit shown in FIG. 7, FIG. 9, FIG. 11 or FIG. 13 to convert its output current into a voltage (clamp potential Vclmp).

[3] Row Decoder and Read Word Line Driver

The row decoder and the read word line driver can be configured from the AND circuit AD1 having a configuration as shown in FIG. 15, similarly to the first embodiment.

[4] Column Decoder

The column decoder can be configured from the AND circuit AD2 having a configuration as shown in FIG. 16, similarly to the first embodiment.

[5] Summary

As described above, according to the read circuit of the second embodiment, the clamp potential Vclmp for limiting the bias current/voltage given to the MTJ element during read depends on temperature without depending on the power supply potential Vdd, thereby enabling the read margin to be enhanced.

(3) Third Embodiment

The present embodiment is concerned with application of the first and second embodiments described above.

In order to maximize the read margin, that is, the signal difference between "0" and "1" that are input to the sense amplifier, the bias current (current conveyer) given to the MTJ element may be set to about the same degree as conductance of the MTJ element.

Furthermore, temperature dependency of the bias current is adjusted so that the bias current is always at about the same degree as the conductance of the MTJ element.

In other words, because the MR ratio of the MTJ element lowers with the rise in temperature and the resistance value of the MTJ element also decreases with the rise in temperature, the bias current is given temperature dependency in which the value of the bias current increases with the rise in temperature.

Taking the circuit of FIG. 7 as an example, the control signal Opt1 is set to "H" and the control signal Opt2 is set to "H" so that the bias current increases with the rise in temperature.

Figure 22:
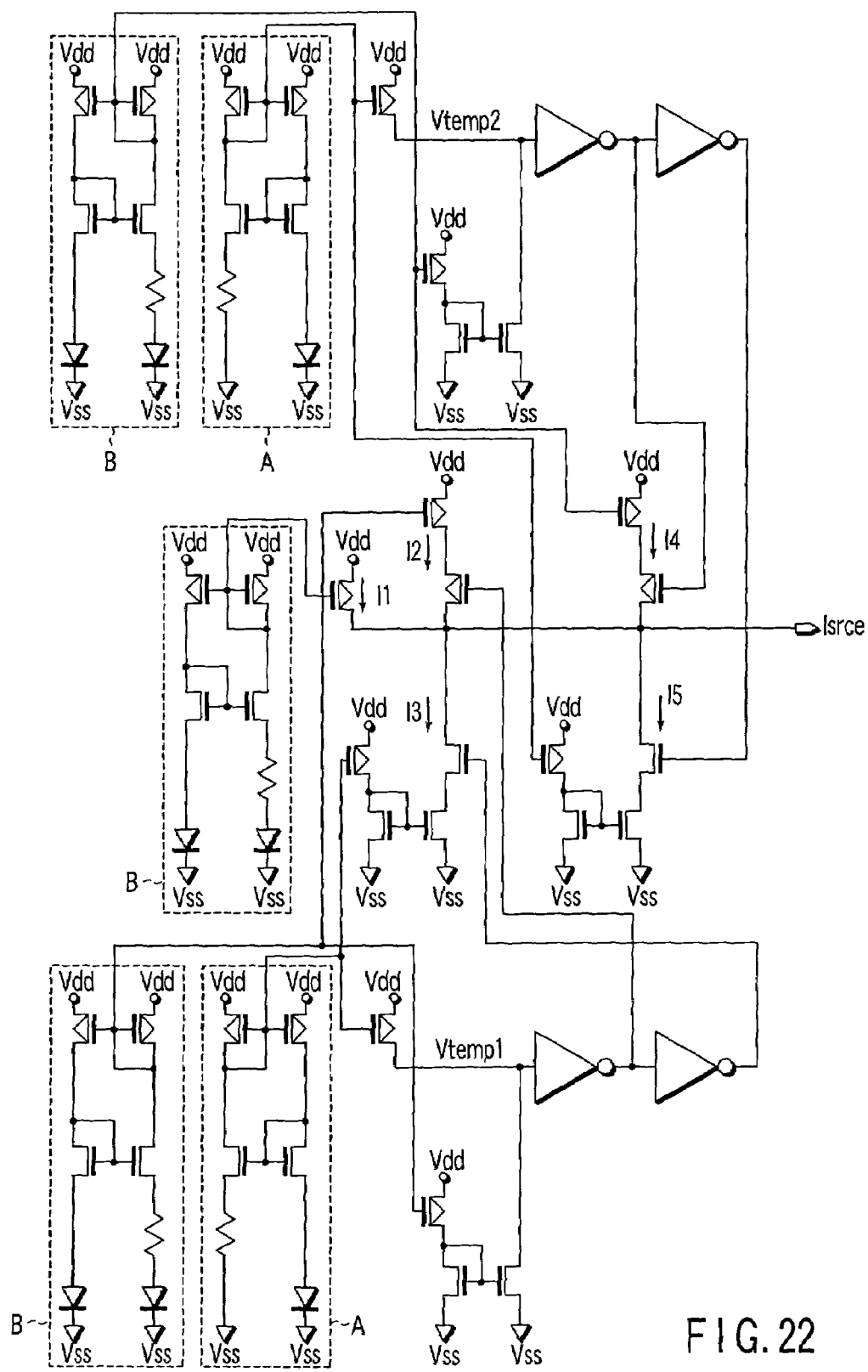
FIG. 22 is a circuit diagram showing the BGR circuit according to a third embodiment.

FIG. 22 shows an example of the BGR circuit suitable for generating the bias current Isrce which increases with the rise in temperature.

This bias current Isrce is supplied to the read circuit as shown in, for example, FIG. 2 (first embodiment) or FIG. 18 (second embodiment).

Figure 23:
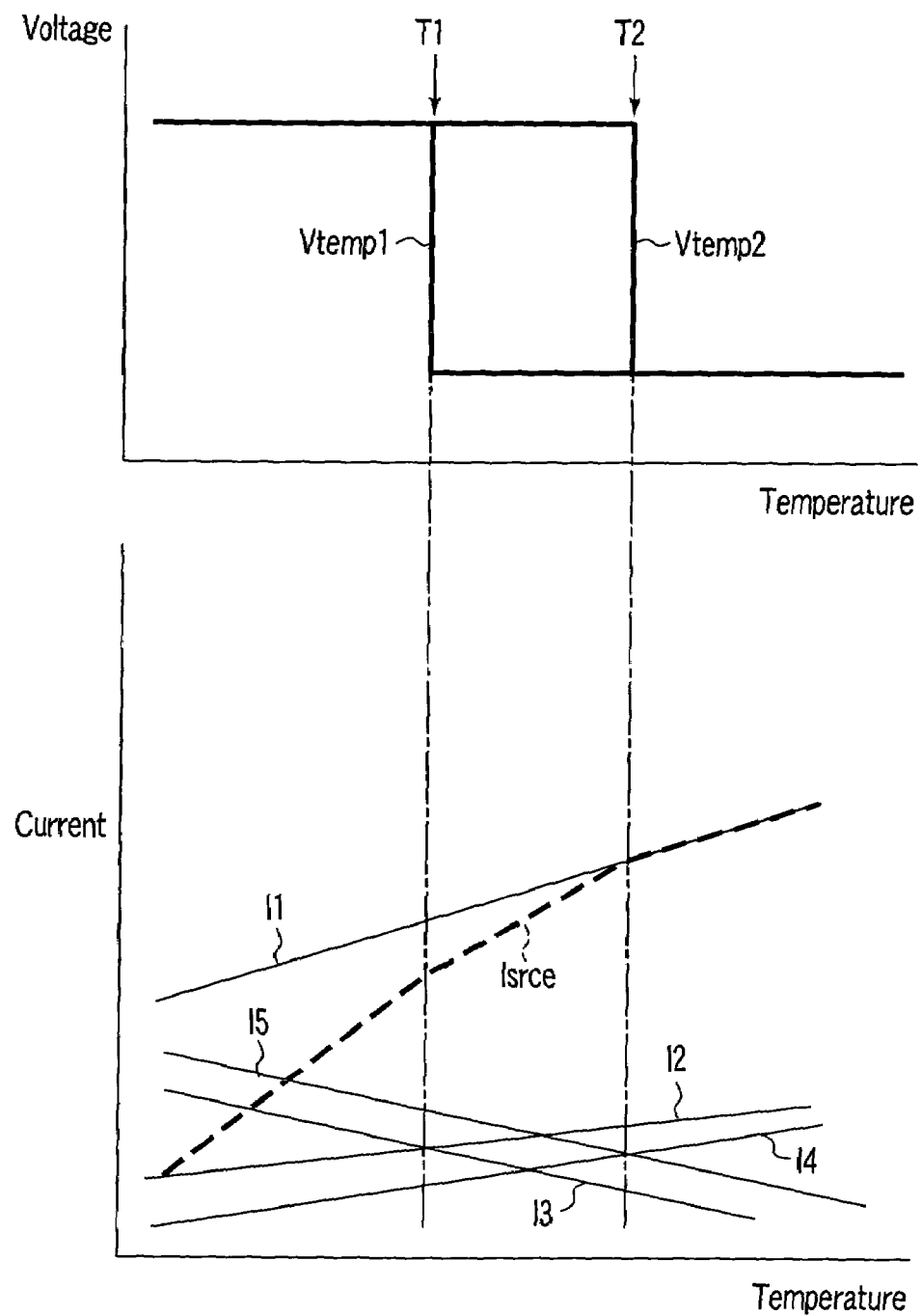
FIG. 23 is a diagram showing the characteristics of the BGR circuit of FIG. 22.

In the BGR circuit in the present example, the line indicating temperature dependency of the bias current Isrce has two bending points, as shown in FIG. 23.

Unlike the BGR circuit in the examples so far described, the BGR circuit in the present example is configured such that the current components I1, I2 and I4 increase with the rise in temperature, while the current components I3 and I5 decrease with the rise in temperature.

From temperature T1, the Vtemp1 and Vtemp2 are both "H" at a temperature lower than temperature T1, and only the current component I1 will be the output current Isrce.

Furthermore, the Vtemp1 is "L" and the Vtemp2 is "H" at a temperature higher than temperature T1 and lower than temperature T2, and a result of subtracting the current component I3 from the total of the current components I1 and I2 will be the output current Isrce.

Furthermore, from temperature T2, the Vtemp1 and Vtemp2 are both "L" at a temperature higher than temperature T2, and a result of subtracting the total of the current components I3 and I5 from the total of the current components I1, I2 and I4 will be the output current Isrce.

According to the read circuit of the third embodiment, the bias current/voltage given to the MTJ element during read has temperature dependency to increase with the rise in temperature, thereby enabling the read margin to be enhanced.

(4) Fourth Embodiment

The present embodiment is characterized in that a monitor circuit is provided to monitor the bias current/voltage or the clamp potential, and that a setting circuit is provided to evaluate and tune temperature characteristics of the bias current/voltage or the clamp potential.

[1] Monitor Circuit

For example, in the first embodiment described above, the output current Isrce is output from the BGR circuit in FIG. 5, FIG. 7, FIG. 9, FIG. 11 or FIG. 13. Therefore, this output current Isrce is received by the monitor circuit (current mirror circuit) as shown in FIG. 24 to lead the output current Isrce to, for example, a monitor pad.

Figure 24:
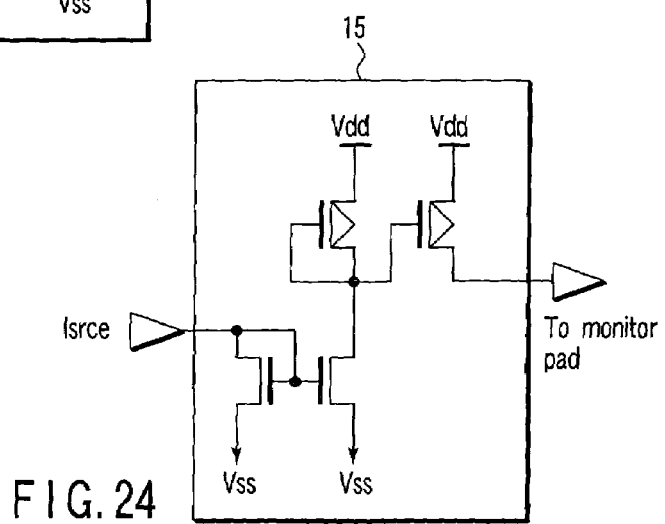
FIG. 24 is a circuit diagram showing a monitor circuit according to a fourth embodiment.

Furthermore, for example, in the second embodiment described above, the current Isrce is received by the monitor circuit (current mirror circuit) as shown in FIG. 24 before the current Isrce is converted to a voltage by the current/voltage converting circuit shown in FIG. 19, and, for example, this output current Isrce is led to the monitor pad.

Then, for example, a terminal of a tester is connected to the monitor pad, and the current Isrce is measured.

Temperature characteristics of the current Isrce are evaluated, and temperature characteristics are tuned so that temperature characteristics will be optimum by, for example, deciding the values of the control signals Opt1 and Opt2 shown in FIG. 5 or FIG. 7.

Here, temperature characteristics of the current Isrce may be tuned at the same time when a die sort test is performed or when defective cells, defective rows or defective columns due to a redundancy process and the like are saved.

Therefore, temperature characteristics of the current Isrce are evaluated in advance, for example, before a chip is sealed into a package.

Furthermore, if temperature characteristics of the current Isrce are evaluated before packaging, the monitor pad does not need to be wire-bonded during the packaging, so that it is either not necessary to attach a protection circuit to the monitor pad.

However, there is not any problem if the monitor pad can be used as an ordinary pad (input/output pad) to which the protection circuit is connected, and the monitor pad may be wire-bonded merely to enable temperature characteristics to be evaluated after packaging.

[2] Setting Circuit

Temperature characteristics are tuned by the control signals Opt1 and Opt2 shown in FIG. 5 or FIG. 7.

The values of the control signals Opt1 and Opt2 are set by the setting circuit as shown in FIG. 25.

In this example of the setting circuit, the value of a control signal Optk (k=1, 2) is stored as fuse data by a fuse element in a storage section M. When this setting circuit is used, temperature characteristics can also be evaluated by use of this setting circuit.

First, if RSSET="H" and bRSSET="L" are set, data D<k> is input from the tester outside the chip into a setting circuit 16. Subsequently, when RSSET="L" and bRSSET="H" are set, the data D<k> is latched by a latch circuit LATCH.

Furthermore, when RSTEST="H" and bRSTEST="L" are set, the data D<k> latched by the latch circuit LATCH is output as control signals Optk, bOptk from the setting circuit 16.

The value of the control signal Optk (k=1, 2) is changed in this manner to evaluate temperature characteristics.

The value of the control signal Optk which enables temperature characteristics regarded as the best by the evaluation to be obtained is decided, and this value is stored by the fuse element in the storage section M (programming of tuning information).

Here, if the fuse element is a laser fusing type, a fuse program is performed by laser blow.

It is to be noted that the fuse element may be an electrically writable electric fuse.

Since RSTEST="L" and bRSTEST="H" are always set in an ordinary operation, the fuse data stored in the storage section M is output as the control signal Optk from the setting circuit 16. In the present example, the control signal Optk is "H" when the fuse element is blown, and the control signal Optk is "L" when the fuse element is not blown.

The value of the control signal Optk (k=1, 2) can also be set by, for example, the setting circuit as shown in FIG. 26.

In an example of this setting circuit, the value of the control signal Optk is stored by the MTJ element in the storage section M.

The process of evaluating and tuning temperature characteristics by use of this setting circuit is the same as that when the setting circuit of FIG. 25 already described is used, and therefore will not be described here.

The setting circuit of the present example is characterized by a method of programming the tuning information into the MTJ element.

The tuning information is programmed by destructing a tunnel insulating layer (tunnel barrier) of the MTJ element. In other words, the present example is concerned with a case in which the MTJ element is used as an antifuse.

The MTJ element is programmed by setting a control signal RSPRO to "H" and inputting the data D<k> from the outside of the chip into the setting circuit 16.

For example, when the data D<k> is "1" (="H"), an output signal of a NAND gate circuit NAND is "0" (="L"). Therefore, an excessive current runs through the MTJ element, and the tunnel insulating layer of the MTJ element is destructed. In this case, the control signal Optk output from the setting circuit 16 in the ordinary operation will be "H".

Furthermore, for example, when the data D<k> is "0" (="L"), the output signal of the NAND gate circuit NAND is "1" (="H"). Therefore, the excessive current does not run through the MTJ element, and the tunnel insulating layer of the MTJ element is not destructed. In this case, the control signal Optk output from the setting circuit 16 in the ordinary operation will be "L".

[4] Summary

According to the fourth embodiment, there are provided the monitor circuit for monitoring the bias current/voltage or the clamp potential, and the setting circuit to evaluate and tune temperature characteristics of the bias current/voltage or the clamp potential, whereby the bias current/voltage or the clamp potential can have the optimum temperature characteristics for each chip.

(5) Fifth Embodiment

The reference potential is generated by use of the MTJ element in the first and second embodiments (FIG. 1 and FIG. 17) described above.

In other words, during read, the memory cell in "0" state and the memory cell in "1" state are connected in parallel, and the reference potential is generated by use of an average value of conductance of these memory cells.

The present embodiment is based on the premise that the reference potential is not generated by use of the MTJ element in the memory cell array as in the first and second embodiments described above, but the reference potential is generated by use of a reference potential generating circuit that has the MTJ element outside the memory cell array or a reference potential generating circuit that does not have the MTJ element.

In such a case, temperature dependency is given to the reference potential output from the reference potential generating circuit.

Here, because the MR ratio of the MTJ elements constituting the memory cell array lowers with the rise in temperature and the resistance value of the MTJ element also decreases with the rise in temperature, the bias current is given temperature dependency in which the value of the bias current increases with the rise in temperature.

Therefore, the reference potential is also given temperature dependency in which the value of the reference potential increases with the rise in temperature.

Figure 27:
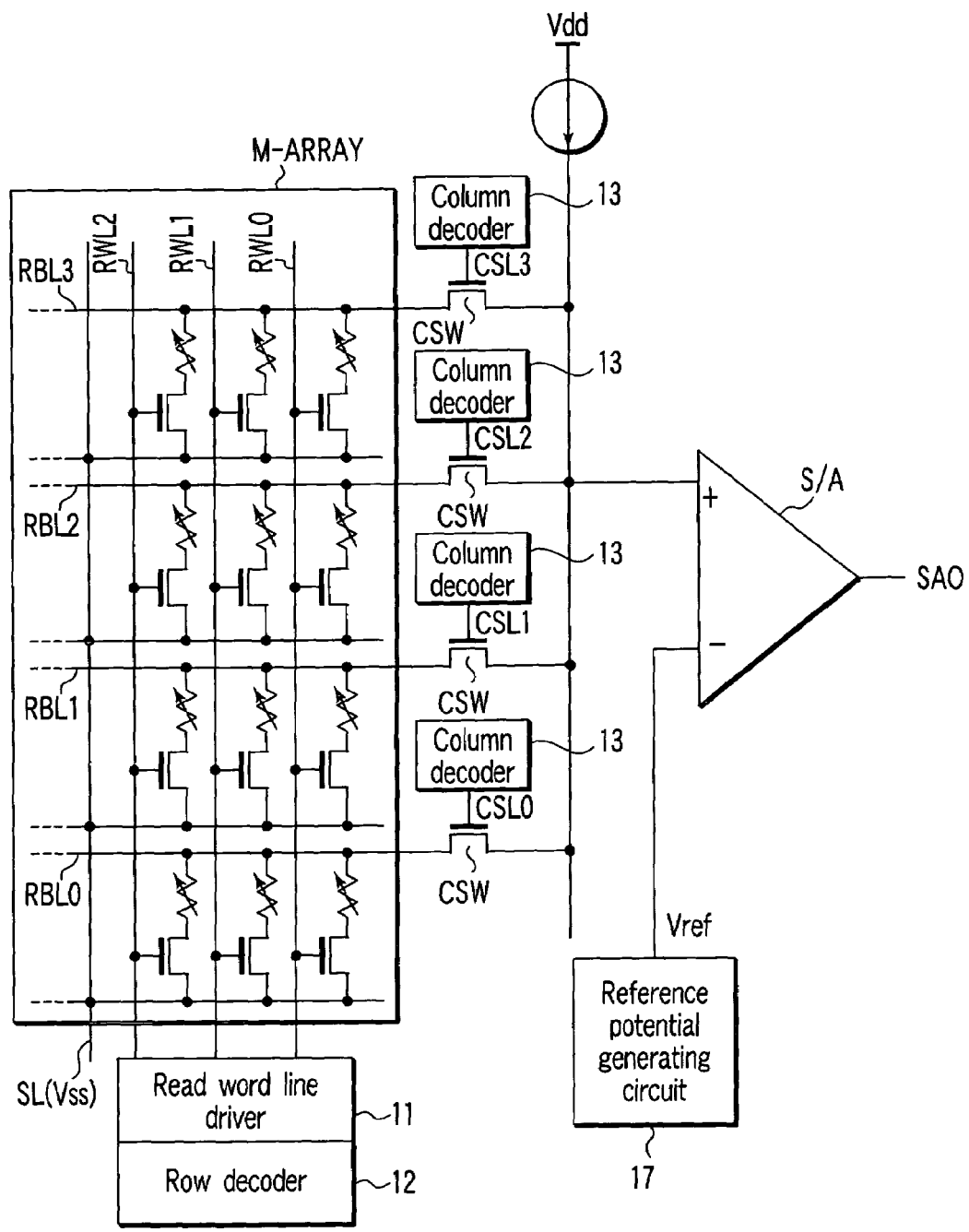
FIG. 27 is a circuit diagram showing the read circuit according to a fifth embodiment.

FIG. 27 shows the read circuit according to a fifth embodiment.

In this read circuit, a reference potential generating circuit 17 generates a reference potential Vref having temperature dependency. The reference potential Vref is input to the inverting terminal of the differential amplifier as the sense amplifier S/A.

Here, for example, when the BGR circuit of FIG. 7 is used for the reference potential generating circuit 17, the control signal Opt1="H" and the control signal Opt2="L" are set so that the output current increases with the rise in temperature. Then, this output current is converted to a voltage to generate the reference potential Vref.

The BGR circuit suitable for generating the output current which increases with the rise in temperature is shown in, for example, FIG. 22.

The output current Isrce of the BGR circuit of FIG. 22 is converted to a voltage by use of a circuit having the same configuration as that of the current/voltage converting circuit shown in FIG. 19, thereby generating the reference potential Vref.

In this BGR circuit, the line indicating temperature dependency of the output current Isrce has two bending points, as shown in FIG. 23.

The current components I1, I2 and I4 increase with the rise in temperature, while the current components I3 and I5 decrease with the rise in temperature.

From temperature T1, the Vtemp1 and Vtemp2 are both "H" at a temperature lower than temperature T1, and only the current component I1 will be the output current Isrce.

Moreover, the Vtemp1 is "L" and the Vtemp2 is "H" at a temperature in a range higher than temperature T1 and lower than temperature T2, and a result of subtracting the current component I3 from the total of the current components I1 and I2 will be the output current Isrce.

Furthermore, from temperature T2, the Vtemp1 and Vtemp2 are both "L" at a temperature higher than temperature T2, and a result of subtracting the total of the current components I3 and I5 from the total of the current components I1, I2 and I4 will be the output current Isrce.

It is to be noted that the reference potential Vref input to the inverting terminal of the differential amplifier as the sense amplifier S/A may be generated by a circuit as shown in, for example, FIG. 28.

In this case, temperature dependency can also be given to the reference potential Vref by giving temperature dependency to the clamp potential Vclmp. The example has already been described in the second embodiment in which temperature dependency is given to the clamp potential Vclmp, and it will not be described in detail here.

According to the fifth embodiment, during read, temperature dependency to increase with the rise in temperature is given to the reference potential output from the reference potential generating circuit, thereby enabling the read margin to be enhanced.

(6) Sixth Embodiment

In the present embodiment, temperature dependency of the bias current/voltage, the clamp potential or the reference potential is controlled by adjusting the resistance value of the resistive element constituting the MTJ element.

Figure 29:
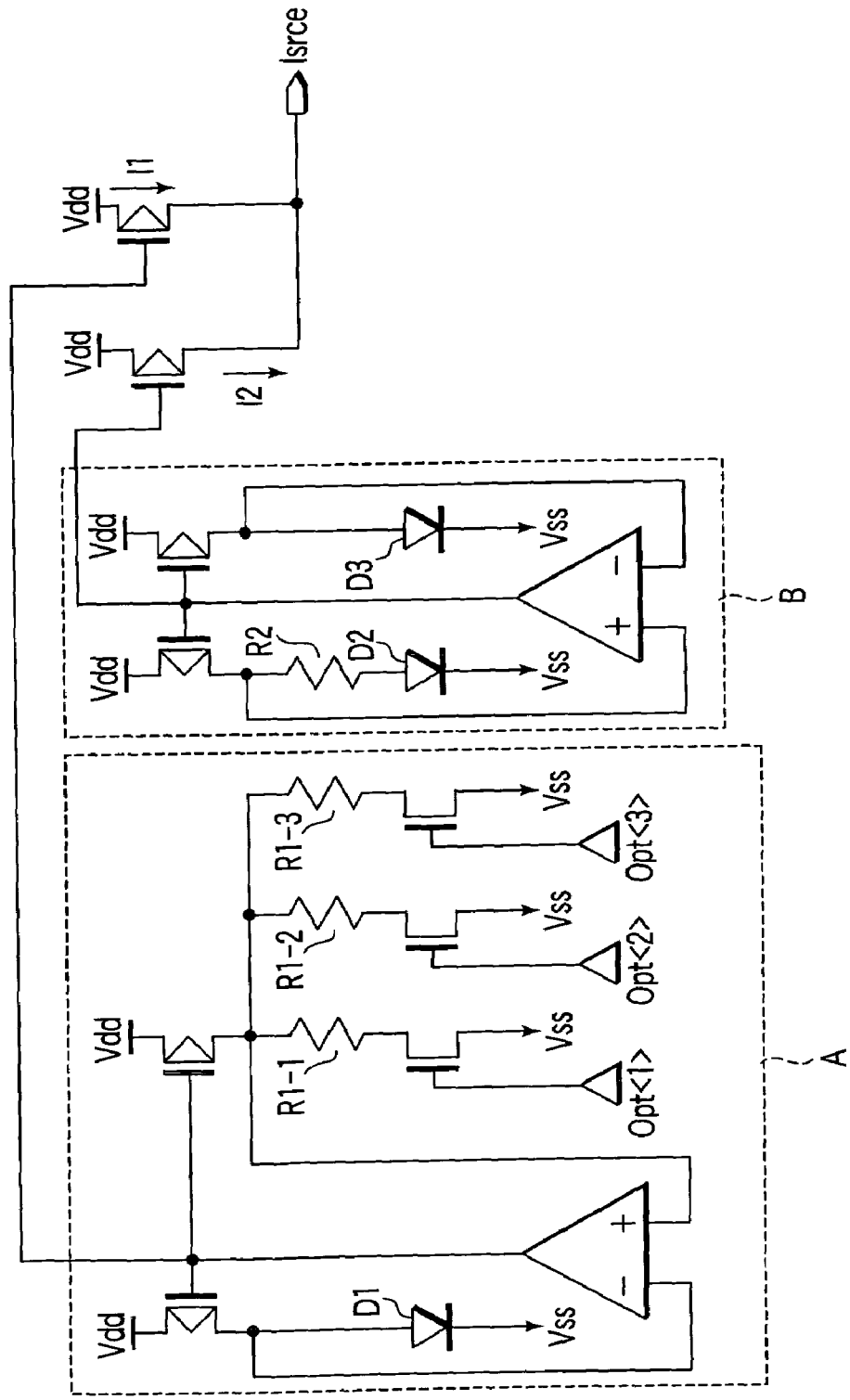
FIG. 29 is a circuit diagram showing the BGR circuit according to a sixth embodiment.

FIG. 29 shows the BGR circuit according to a sixth embodiment.

This BGR circuit comprises the circuit A to generate the current component I1 which decreases with the rise in temperature, and the circuit B to generate the current component I2 which increases with the rise in temperature.

By adding together the current components I1 and I2 generated by the two circuits A and B, it is possible to generate the output current Isrce having optional temperature characteristics.

If the anode potential of the diode D1 is Vd and the resistance value by resistors R1-1, R1-2 and R1-3 is r1, the current component I1 which decreases with the rise in temperature can be expressed as $$I1 = Vd/r1$$

due to the effect of the feedback circuit.

However, if resistance values r1-1, r1-2 and r1-3 of the resistors R1-1, R1-2 and R1-3 are all different, the resistance value r1 can take seven values in accordance with values of control signals Opt<1>, Opt<2> and Opt<3>.

Furthermore, if the potential difference between the anodes of the two diodes D2 and D3 is ΔVd and the resistance value of the resistor R2 is r2, the current component I2 which increases with the rise in temperature can be expressed as $$I2 = \Delta Vd/r2$$

due to the effect of the feedback circuit.

Here, in the present example, the values of the control signals Opt<1>, Opt<2> and Opt<3> can be controlled to give temperature dependency to the output current Isrce.

It is to be noted that there are the three control signals Opt<1>, Opt<2> and Opt<3> in the present example, but any number of control signals may be accepted.

A specific example will be described.

The output current Isrce does not have temperature dependency in such a state as $$Isrce = I1 + \alpha \cdot I2$$
$$= Vd/r1' + \alpha \cdot \Delta Vd/r2$$
$$r1 = r1'.$$

r1=r1'.

Here, it is assumed that all the resistance values r1-1, r1-2 and r1-3 of the resistors R1-1, R1-2 and R1-3 are the same value r for simplification of the description. r1' is equivalent to r/2.

In this case, for example, if all the control signals Opt<1>, Opt<2> and Opt<3> are set to "H" and the resistance value r1' is changed to r1" (=r/3< r1'), the current component I1 which decreases with the rise in temperature will be increased, with the result that the output current Isrce will have the characteristics to decrease with the rise in temperature.

Furthermore, for example, if only one of the control signals Opt<1>, Opt<2> and Opt<3> is set to "H" and the resistance value r1' is changed to r1'" (r>r1'), the current component I1 which decreases with the rise in temperature will be decreased, with the result that the output current Isrce will have the characteristics to increase with the rise in temperature.

It is to be noted that the resistance value of the resistive element in the circuit A which generates the current component I1 decreasing with the rise in temperature is adjusted in the present example, but, for example, the resistance value of the resistive element in the circuit B which generates the current component I2 increasing with the rise in temperature may be adjusted, or both of them may be combined.

A case will be considered in which a resistance value r2 of a resistive element R2 in the circuit B which generates the current component I2 increasing with the rise in temperature is changed.

In this case, for example, if the resistance value r2 is changed to r2' (<r2), the current component I2 which increases with the rise in temperature will be increased, with the result that the output current Isrce will have the characteristics to increase with the rise in temperature.

Furthermore, for example, if the resistance value r2 is changed to r2" (>r2), the current component I2 which increases with the rise in temperature will be decreased, with the result that the output current Isrce will have the characteristics to decrease with the rise in temperature.

According to the sixth embodiment, by use of the control signals, the resistance value of the resistive element constituting the BGR circuit is switched, and at least one of the current component I1 which decreases with the rise in temperature and the current component I2 which increases with the rise in temperature is changed, whereby the bias current/voltage, the clamp potential or the reference potential having desired temperature dependency can be generated.

(7) Seventh Embodiment

The present embodiment is concerned with a search circuit which searches for the optimum value of the bias current/voltage and the optimum value of a clamp voltage given to the MTJ element during read.

(1) Search Circuit

For example, as shown in FIG. 30, a search circuit 22 comprises a potential generating circuit 18 which generates two kinds of clamp potentials VclmpA and VclmpB, a signal difference comparing circuit 19 which searches for the optimum value of the bias current/voltage and the optimum value of the clamp voltage and which outputs an output signal Retain as a search result, and a setup code output circuit 23 which stores the optimum value of the bias current/voltage and the optimum value of the clamp voltage as setup codes and which outputs the setup codes in an ordinary read operation.

[1] Potential Generating Circuit.

Figure 31:
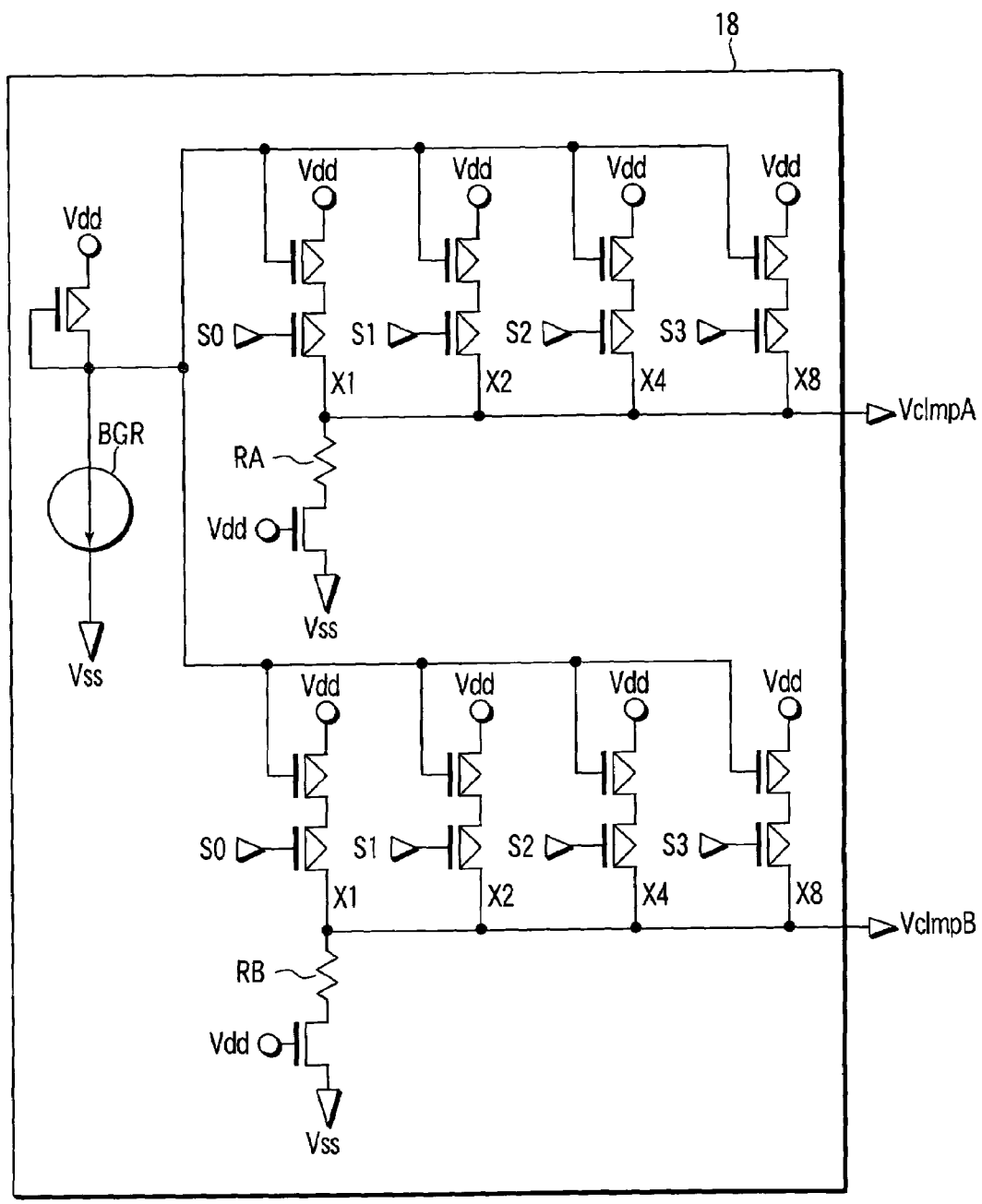
FIG. 31 is a circuit diagram showing a potential generating circuit of FIG. 30.

First, the potential generating circuit 18 as shown in FIG. 31 is used to generate the two kinds of clamp potentials VclmpA and VclmpB. A current source BGR is configured by, for example, the BGR circuit.

Furthermore, for example, when a relationship of VclmpA<VclmpB is produced, the relationship between a resistance value rA of a resistor RA and a resistance value rB of a resistor RB is set to rA<rB.

Control signals S0, S1, S2 and S3 can be controlled to control the amount of current flowing through the resistors RA and RB and change the values of the clamp potentials VclmpA and VclmpB.

For example, as compared with the size (×1) of a transistor to receive the control signal S0, the size of a transistor to receive the control signal S1 is twice (×2), and the size of a transistor to receive the control signal S2 is quadruple (×4), and the size of a transistor to receive the control signal S3 is eightfold (×8).

In this case, one of the control signals S0, S1, S2 and S3 can be set to "H" to change the values of the clamp potentials VclmpA and VclmpB.

It is to be noted that the control signals S0, S1, S2 and S3 are output from, for example, a binary counter and will be "H" in the order, for example, beginning with the control signal S0.

[2] Signal Difference Comparing Circuit

Figure 32:
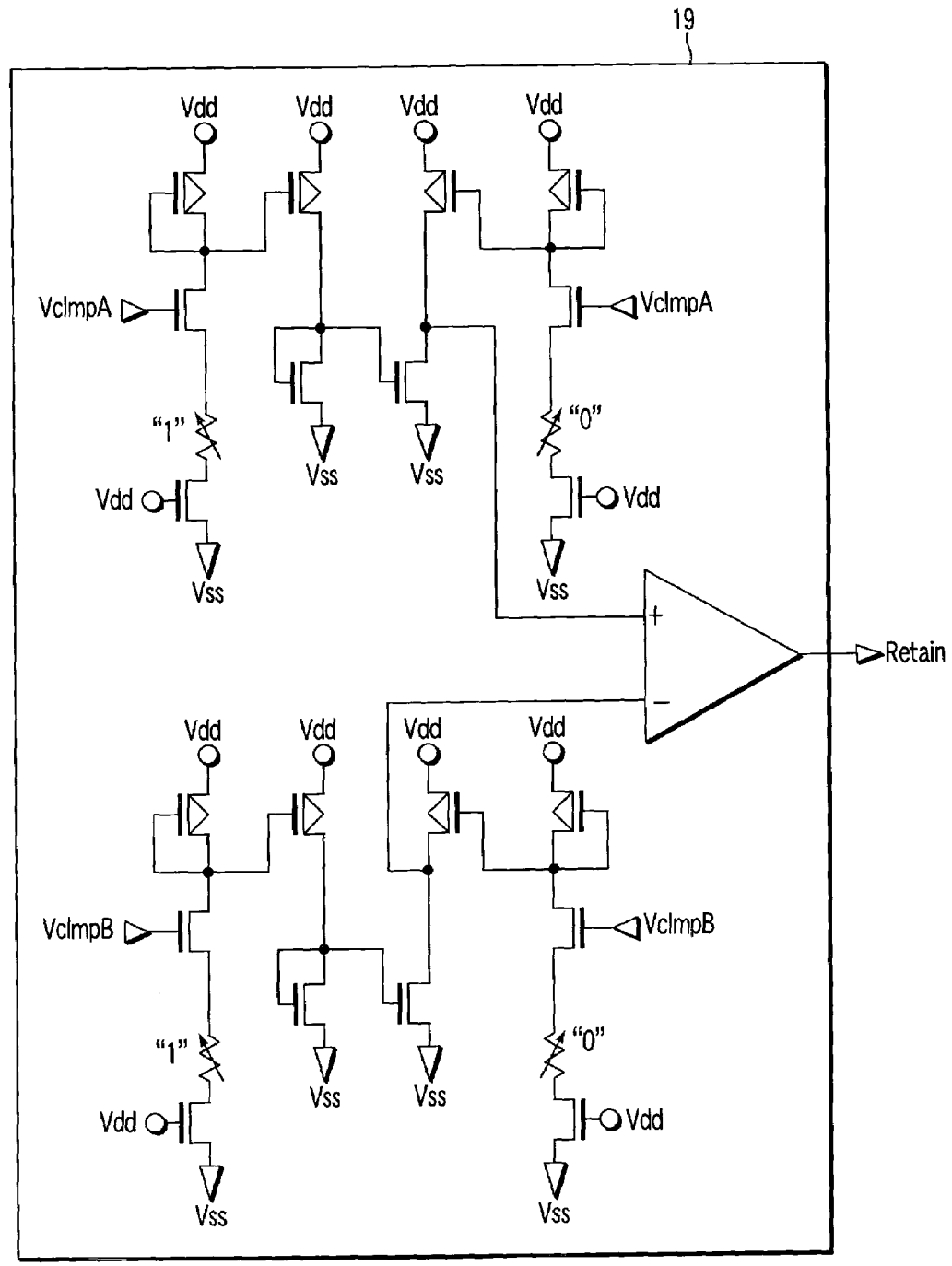
FIG. 32 is a circuit diagram showing a signal difference comparing circuit of FIG. 30.

Next, the signal difference comparing circuit 19 as shown in FIG. 32 is used to find out which of the two clamp potentials VclmpA and VclmpB can be used to obtain the optimum value of the bias current/voltage and the optimum value of the clamp voltage at a current temperature (specific temperature).

Here, the optimum value of the bias current/voltage and the optimum value of the clamp voltage are values at which the signal difference of signals which can respectively be obtained from two magnetoresistive elements (replicas) in different states is maximized.

In other words, this circuit is used to judge which of the two clamp potentials VclmpA and VclmpB can be used to have a larger signal difference between "1" and "0".

The MTJ element in "1" state and the MTJ element in "0" state as replicas having the same shape as the memory cell are prepared, and a signal is generated in which a difference between the value of a current flowing through the MTJ element in "0" state and the value of a current flowing through the MTJ element in "1" state when the clamp potential VclmpA is used is converted into a voltage.

This signal is input to the noninverting terminal of the differential amplifier.

Furthermore, the MTJ element in "1" state and the MTJ element in "0" state as replicas having the same shape as the memory cell are prepared, and a signal is generated in which a difference between the value of a current flowing through the MTJ element in "0" state and the value of a current flowing through the MTJ element in "1" state when the clamp potential VclmpB is used is converted into a voltage.

This signal is input to the inverting terminal of the differential amplifier.

Those signals are then compared by the differential amplifier.

If the signal difference when the clamp potential VclmpA is used is larger than the signal difference when the clamp potential VclmpB is used, the output signal Retain of the differential amplifier will be "H". On the other hand, if the signal difference when the clamp potential VclmpB is used is larger than the signal difference when the clamp potential VclmpA is used, the output signal Retain of the differential amplifier will be "L".

When the Retain is "H", the value of an output signal of a binary counter 21 is counted up, and the values of the clamp potentials VclmpA and VclmpB are changed. In other words, for example, when the control signal S0 is "H", if the Retain becomes "H", the control signal S1 will then be set to "H", and the signal difference when the two kinds of clamp potentials VclmpA and VclmpB are used is again compared.

Furthermore, for example, the clamp potential VclmpB when the Retain is "L" is selected as a value at which the optimum value of the bias current/voltage and the optimum value of the clamp voltage for the MTJ element at the specific temperature can be obtained.

These optimum values are stored as the setup codes into the setup code output circuit 23, and output codes thereof are output from the setup code output circuit 23 in the ordinary read operation.

It is to be noted that, for example, the values of the clamp potential VclmpA and VclmpB are set to the lowest values as initial values and gradually transit to higher values by being counted up, as described above.

Alternatively, for example, the initial values of the clamp potential VclmpA and VclmpB are set to the highest values, and gradually shifted to the lower values by being counted down when the Retain is "L", and the clamp potential VclmpA when the Retain is "H" may be selected as a value at which the optimum value of the bias current/voltage and the optimum value of the clamp voltage for the MTJ element at the specific temperature can be obtained.

[3] Example of MRAM Chip Including Search Circuit

Figure 33:
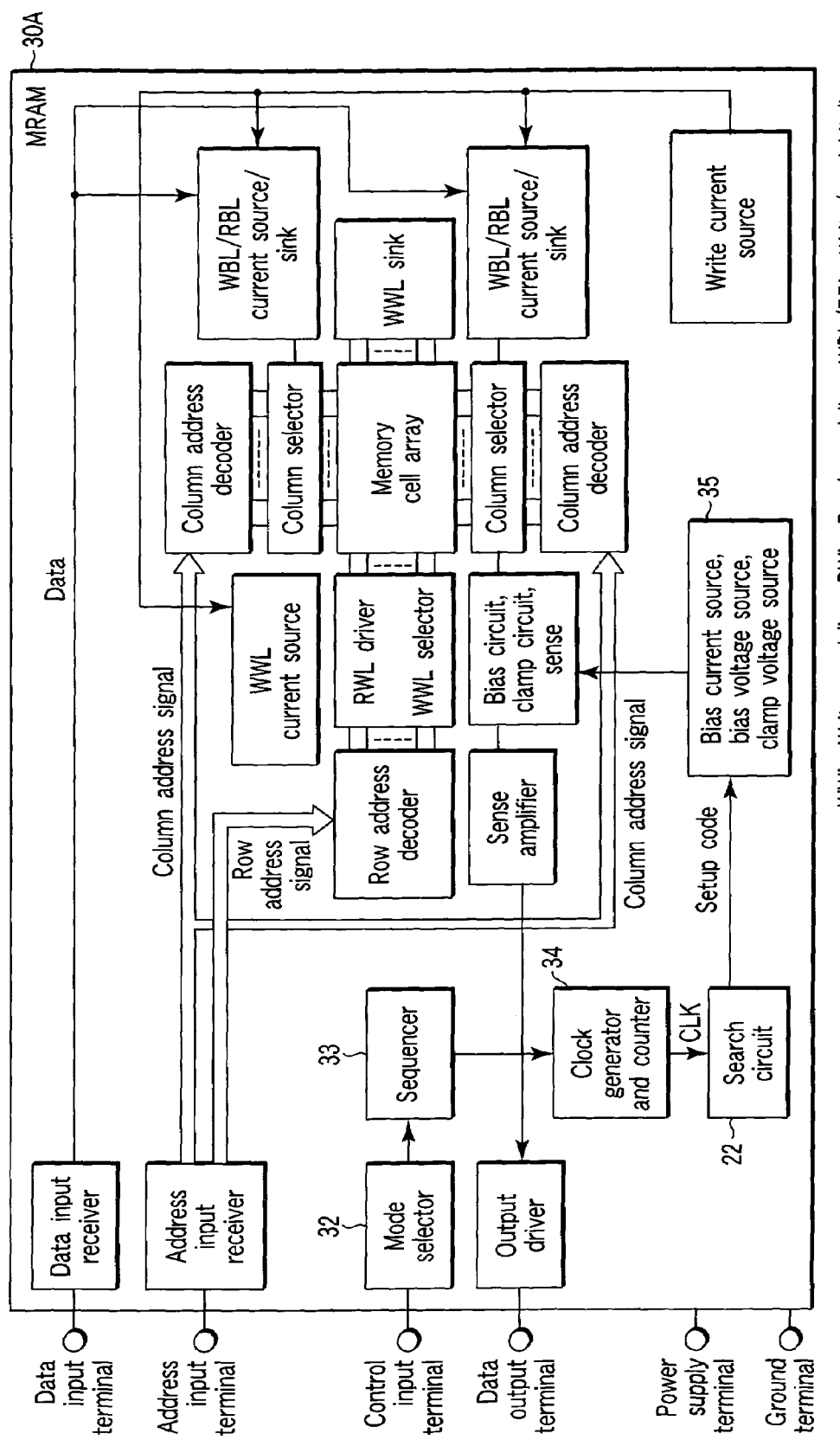
FIG. 33 is a block diagram of an MRAM chip including the search circuit.

FIG. 33 shows an example of a block diagram of an MRAM chip including the search circuit.

An MRAM chip 30A includes the search circuit 22 as shown in FIG. 30 to FIG. 32.

If the control signal is input to a control input terminal to bring, for example, a search mode to search for the optimum value of the bias current/voltage and the optimum value of the clamp voltage during read, a mode selector 32 selects the search mode and informs a sequencer 33 of this. A clock generator and counter 34 outputs a clock signal CLK when receiving a signal from the sequencer 33. The search circuit 22 outputs the setup code (which will be a test signal during search) synchronously with the clock signal CLK, and searches for the optimum value of the bias current/voltage and the optimum value of the clamp voltage during read.

On the other hand, in the ordinary read operation, the setup code output circuit in the search circuit 22 outputs the setup code that indicates the optimum value of the bias current/voltage and the optimum value of the clamp voltage. This setup code is given to a bias current/voltage source and clamp voltage source 35. The bias current/voltage source and clamp voltage source 35 generates the optimum bias current/voltage and clamp voltage in accordance with the setup code.

Figure 34:
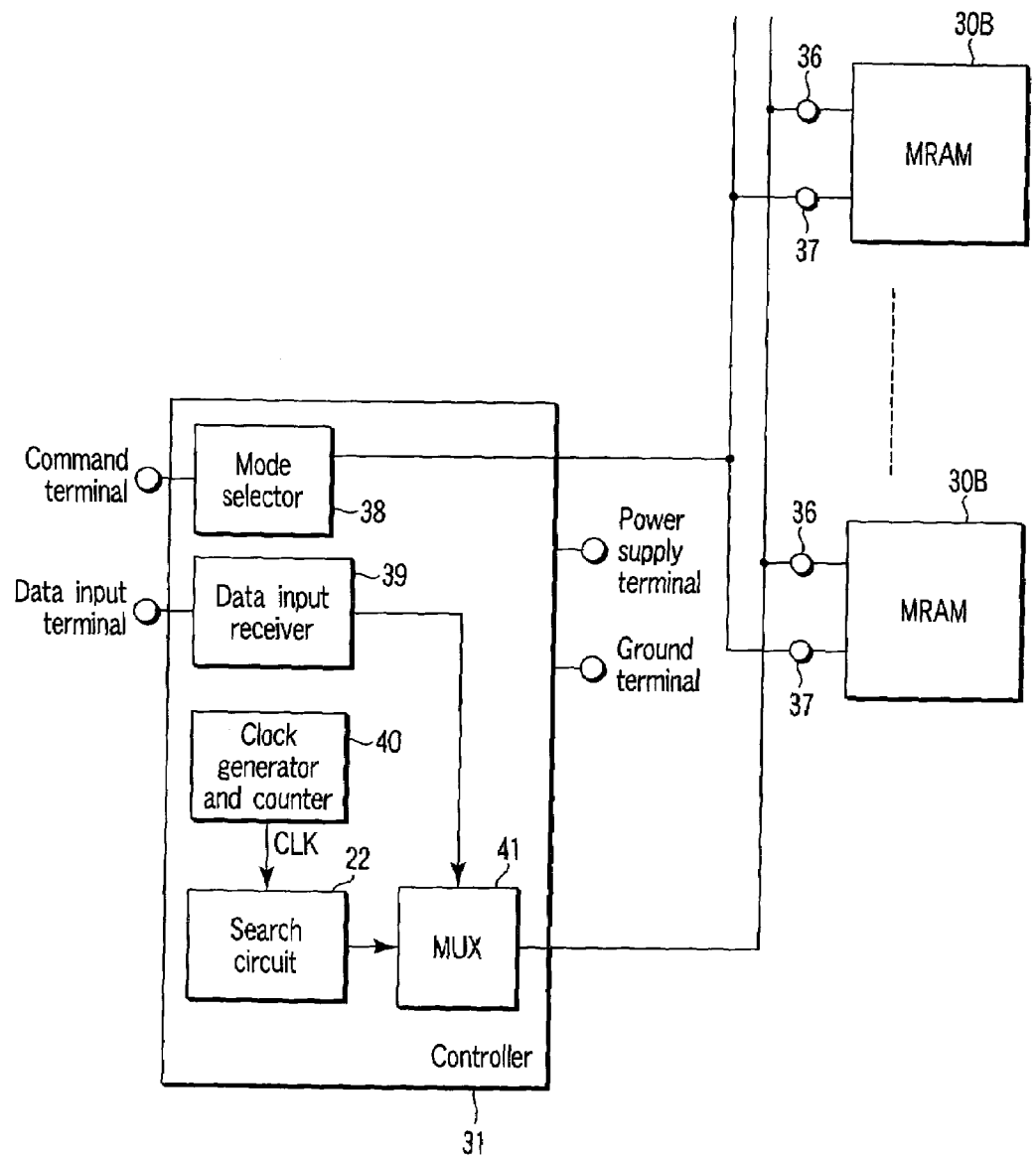
FIG. 34 is a block diagram of a memory system having a controller including the search circuit.
Figure 35:
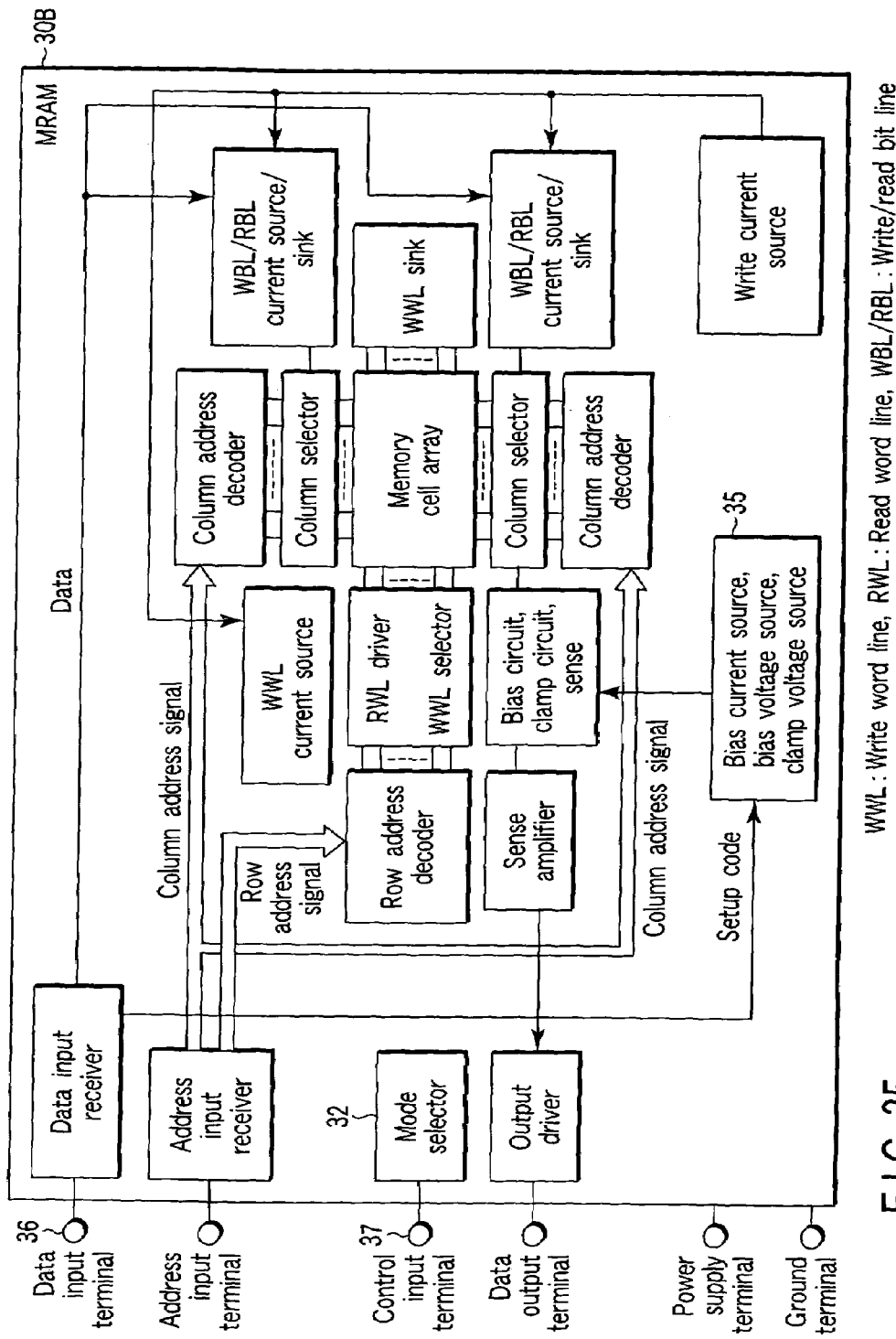
FIG. 35 is a block diagram of the MRAM chip in the memory system of FIG. 34.

[4] Example of Memory System Which Comprises Controller Including the Search Circuit and the MRAM Chip FIG. 34 shows an example of a memory system which comprises a controller including the search circuit and the MRAM chip. FIG. 35 shows an example of the MRAM chip of FIG. 34.

A controller 31 includes the search circuit 22 as shown in FIG. 30 to FIG. 32.

In the search mode to search for the optimum value of the bias current/voltage and the optimum value of the clamp voltage during read, a mode selector 38 selects the search mode, and an MRAM chip 30B is also informed of this via a control input terminal 37 and the mode selector 32.

A clock generator and counter 40 generates the clock signal CLK, and a multiplexer (MUX) 41 causes data from a data input receiver 39 to be unselected and selects an output signal of the search circuit 22. Therefore, the setup code (which will be the test signal during search) from the search circuit 22 is given to the bias current/voltage source and clamp voltage source 35 via a data input terminal 36 and a data input receiver 42.

Therefore, the search circuit 22 in the controller 31 searches for the optimum value of the bias current/voltage and the optimum value of the clamp voltage, during read in the MRAM chip 30B.

On the other hand, in the ordinary read operation, the setup code output circuit in the search circuit 22 outputs the setup code that indicates the optimum value of the bias current/voltage and the optimum value of the clamp voltage. This setup code is given to the bias current/voltage source and clamp voltage source 35. The bias current/voltage source and clamp voltage source 35 generates the optimum bias current/voltage and clamp voltage in accordance with the setup code.

This memory system can be applied to portable devices such as mobile telephones and digital cameras, and to memory cards used in these devices.

3. Others

In the magnetic random access memory according to the examples of the present invention, for example, the MOS transistors as the selecting switch constituting the memory cell may be the P-channel type instead of the N-channel type.

Any configuration can be used for the MTJ element.

For example, it is possible to use the MTJ element having a spin-valve structure in which a secured layer (pin layer) is constituted of a ferromagnetic layer and an antiferromagnetic layer, or the MTJ element having a laminated structure in which memory layers (free layers) sandwich a paramagnetic metal by the ferromagnetic layers.

Furthermore, it is also possible to use the MTJ element in which the ferromagnetic layers constituting the laminated structure are ferromagnetically bonded, the MTJ element in which the ferromagnetic layers constituting the laminated structure are antiferro-magnetically bonded, or the MTJ element having these ferromagnetic bonding and antiferromagnetic bonding.

It is also possible to use the MTJ element having a synthetic pin structure in which the secured layers sandwich the paramagnetic metal by the ferromagnetic layers, or the MTJ element having a double-junction structure.

According to the examples of the present invention, the read margin can be enhanced by providing the read circuit which considers temperature dependency of the TMR.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general invention concept as defined by the appended claims and their equivalents.

What is claimed is:

1. A magnetic random access memory comprising:
a first magneto resistive element; and
a first current source circuit which gives a first electric bias to the first magneto resistive element when data in the first magneto resistive element is read,
wherein a value of the first electric bias changes depending on temperature without depending on a power supply potential.

2. The magnetic random access memory according to claim 1, further comprising:
a search circuit which searches for an optimum value of the first electric bias at a specific temperature, wherein the optimum value is a value at which a signal difference of signals respectively obtained from two magneto resistive elements in different states is maximized.

3. The magnetic random access memory according to claim 2, wherein
the search circuit is constituted of a potential generating circuit which outputs first and second clamp potentials having different values, and a signal difference comparing circuit which compares the signal difference when the first clamp potential is used with the signal difference when the second clamp potential is used, and the values of the first and second clamp potentials are decided on the basis of control signals.

4. The magnetic random access memory according to claim 1, wherein
the value of the first electric bias is controlled so that a potential difference produced between both ends of the first magneto resistive element will be half of an MR ratio when "0" bias is applied to the first magneto resistive element.

5. The magnetic random access memory according to claim 4, wherein
the potential difference produced between both ends of the first magneto resistive element changes depending on temperature without depending on the power supply potential.

6. The magnetic random access memory according to claim 1, further comprising: a BGR circuit which gives a reference current to the first current source circuit, wherein a value of the reference current changes depending on temperature without depending on the power supply potential.

7. The magnetic random access memory according to claim 6, wherein
temperature dependency of the reference current is decided on the basis of the control signal.

8. The magnetic random access memory according to claim 6, wherein
temperature dependency of the reference current is different among a plurality of temperature ranges separated by at least one temperature point.

9. The magnetic random access memory according to claim 6, wherein
temperature dependency of the reference current is such that the value of the reference current decreases with a rise in temperature.

10. The magnetic random access memory according to claim 6, wherein
temperature dependency of the reference current is such that the value of the reference current increases with the rise in temperature.

11. The magnetic random access memory according to claim 1, further comprising:
a second magneto resistive element which generates a reference potential; and
a second current source circuit which gives a second electric bias to the second magneto resistive element when data in the first magneto resistive element is read,
wherein a value of the second electric bias changes depending on temperature without depending on the power supply potential.

12. The magnetic random access memory according to claim 11, wherein
the value of the second electric bias is controlled so that a potential difference produced between both ends of the second magneto resistive element will be half of the MR ratio when "0" bias is applied to the second magneto resistive element.

13. The magnetic random access memory according to claim 12, wherein
the potential difference produced between both ends of the second magneto resistive element changes depending on temperature without depending on the power supply potential.

14. The magnetic random access memory according to claim 1, further comprising:
means for limiting the value of the first electric bias to a constant value on the basis of a clamp potential; and
a clamp potential generating circuit which generates the clamp potential,
wherein a value of the clamp potential changes depending on temperature without depending on the power supply potential.

15. The magnetic random access memory according to claim 11, further comprising:
means for limiting the value of the second electric bias to a constant value on the basis of a clamp potential; and
a clamp potential generating circuit which generates the clamp potential,
wherein a value of the clamp potential changes depending on temperature without depending on the power supply potential.

16. The magnetic random access memory according to claim 1, further comprising:
a monitor circuit which monitors the first electric bias when temperature dependency of the first electric bias is evaluated.

17. The magnetic random access memory according to claim 1, further comprising:
a setting circuit which receives the control signal to decide temperature dependency of the first electric bias when temperature dependency of the first electric bias is evaluated.

18. The magnetic random access memory according to claim 17, wherein
the setting circuit stores tuning information to decide temperature dependency of the first electric bias after the evaluation, and decides temperature dependency of the first electric bias on the basis of the tuning information during an ordinary operation.

19. The magnetic random access memory according to claim 1, further comprising:

a sense amplifier which, when data in the first magneto resistive element is read, judges a value of the data on the basis of the reference potential; and a reference potential generating circuit which generates the reference potential, wherein a value of the reference potential changes depending on temperature without depending on the power supply potential.

20. The magnetic random access memory according to claim 6, wherein temperature dependency of the reference current is decided on the basis of a control signal which decides a resistance ratio among a plurality of resistive elements constituting the BGR circuit.

21. A memory system comprising:

the magnetic random access memory according to claim 1; and a controller controlling an operation of the magnetic random access memory, wherein the controller has a search circuit which searches for the optimum value of the electric bias at a specific temperature, and the optimum value is a value at which a signal difference of signals respectively obtained from two magneto resistive elements in different states is maximized.

* * * * *